United States Patent
Utsumi et al.

(10) Patent No.: US 7,071,617 B2
(45) Date of Patent: Jul. 4, 2006

(54) LIGHT-EMITTING APPARATUS AND METHOD FOR FORMING THE SAME

(75) Inventors: Tetsuya Utsumi, deceased, late of Kariya (JP); Tomoko Utsumi, legal representative, Kariya (JP); Masaaki Arima, Kariya (JP); Masayuki Harada, Kariya (JP); Mari Funada, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 73 days.

(21) Appl. No.: 10/844,923

(22) Filed: May 13, 2004

(65) Prior Publication Data

US 2004/0227462 A1 Nov. 18, 2004

(30) Foreign Application Priority Data

May 16, 2003 (JP) ............................ 2003-139485
May 16, 2003 (JP) ............................ 2003-139486

(51) Int. Cl.
*H01J 1/62* (2006.01)
*H01J 63/04* (2006.01)
*B32B 3/10* (2006.01)

(52) U.S. Cl. ........................ 313/506; 313/498; 428/140

(58) Field of Classification Search ................. 313/498, 313/506

See application file for complete search history.

(56) References Cited

U.S. PATENT DOCUMENTS

| | | | |
|---|---|---|---|
| 4,972,117 A * | 11/1990 | Adler et al. ................. 313/478 |
| 5,977,708 A * | 11/1999 | Amatsu et al. .............. 313/586 |
| 6,433,487 B1 * | 8/2002 | Yamazaki ..................... 313/506 |
| 6,954,031 B1 * | 10/2005 | Hashimoto et al. .......... 313/503 |
| 2003/0057417 A1 * | 3/2003 | Lee et al. ..................... 257/40 |
| 2003/0180476 A1 * | 9/2003 | Yamashita et al. ........... 428/141 |
| 2004/0189184 A1 * | 9/2004 | Yasuda ......................... 313/498 |
| 2004/0239240 A1 * | 12/2004 | Kato ............................. 313/506 |
| 2004/0253413 A1 * | 12/2004 | Baba et al. ................... 313/504 |

FOREIGN PATENT DOCUMENTS

| JP | 1-186587 | 7/1989 |
|---|---|---|
| JP | 01-186588 | 7/1989 |
| JP | 9-50031 | 2/1997 |
| JP | 9-129375 | 5/1997 |

(Continued)

OTHER PUBLICATIONS

Filed May 13, 2004, Tetsuya Utsumi (deceased); Masaaki Arima; Masayuki Harada and Mari Funada.

*Primary Examiner*—Joseph Williams
*Assistant Examiner*—Peter Macchiarolo
(74) *Attorney, Agent, or Firm*—Morgan & Finnegan, LLP

(57) ABSTRACT

In a light-emitting apparatus, a face of a substrate on which a light-emitting device is formed is an uneven surface having a plurality of asperities. The mean spacing Sm of adjacent asperities or the mean spacing S of peaks of adjacent projections of the asperities is no less than three times the longest wavelength of light generated by a light-emitting layer and no more than two hundred times the longest wavelength. The arithmetic mean slope Δa of the uneven surface is in a range between 4° and 30°, inclusive. Therefore, the apparatus emits substantially a greater amount of light from a light extraction side and has less brightness unevenness than a light-emitting apparatus with no uneven surface.

13 Claims, 13 Drawing Sheets

FOREIGN PATENT DOCUMENTS

| | | | |
|---|---|---|---|
| JP | 10144469 A * | 5/1998 | |
| JP | 2000-40584 | 2/2000 | |
| JP | 2002-352956 | 12/2002 | |
| JP | 2003059641 A * | 2/2003 | |

* cited by examiner

Light Extraction Side

Light Extraction Side

Light Extraction Side

LIGHT-EMITTING APPARATUS AND METHOD FOR FORMING THE SAME

BACKGROUND OF THE INVENTION

The present invention relates to a light-emitting apparatus having a substrate on which a light-emitting device is formed. The light-emitting device is an organic electroluminescent device (organic EL device) or an inorganic electroluminescent element (inorganic EL elements). Such a device has a light-emitting layer held between a pair of electrodes. The present invention also pertains to a method for forming the apparatus.

Lighting systems and displays using a light-emitting apparatus such as an organic electroluminescent apparatus (organic EL apparatus) and an inorganic electroluminescent apparatus (inorganic EL apparatus) have been proposed.

Such light-emitting apparatuses are known for low extraction efficiency. That is, the ratio of the light that is extracted outside from the apparatus to the light generated by a light-emitting layer is low. This is because layers forming a light-emitting apparatus have different refractive indices.

For example, in an organic EL apparatus of a bottom emission type shown in FIG. 22, all the light that is generated by an organic light-emitting layer 211 is extracted outside from the apparatus through a transparent first electrode 201 and a transparent substrate 100. Some of the light attenuates in the apparatus as a ray h4, and some of the light is extracted outside the apparatus through an edge of the apparatus as a ray h5.

In this manner, the conventional light-emitting apparatus cannot extract all the light generated by the light-emitting layer 211 to the outside of the apparatus from a light exit surface A.

With this respect, a first prior art has been proposed in which an uneven surface having asperities is formed on a transparent substrate, and an organic EL device is formed on the uneven surface (for example, Japanese Laid-Open Patent Publication No. 1-186587). The first prior art discloses a technique related to a display using an inorganic EL apparatus, in which one pixel is provided for each of pits and projections of the asperities so that light trapped in a light-emitting film is reflected by steps formed by the asperities. Accordingly, the amount of light extracted outside the transparent substrate is increased.

The extraction efficiency of a light-emitting apparatus can be improved by reflecting light that is directed in a direction opposite a light extraction side with respect to a light-emitting layer. Specifically, an electrode provided on a side of the light-emitting layer that is opposite from the light extraction side may be made of a light reflecting material such as Al. Alternatively, a light reflecting member may be provided on a side of the light-emitting layer that is opposite from the light extraction side. In these cases, however, when the light-emitting layer is not producing light, specular reflection of external light occurs.

With this respect, a second prior art has been proposed in which dot-like asperities are formed at random on a transparent substrate, and electrodes and a light-emitting layer are provided on the asperities (for example, Japanese Laid-Open Patent Publication No 2000-40584). The second prior art prevents glare due to specular reflection of the metal electrode.

A third prior art discloses a technique applied to a substrate of an organic EL apparatus that has organic EL device and is used as a backlight of a liquid crystal display panel. The technique pertains to forming asperities on the substrate of the apparatus (for example, Japanese Laid-Open Patent Publication No. 9-50031). According to the third prior art, the substrate with the asperities functions as a diffusion plate, so that, when the organic EL apparatus is used as a reflection plate, specular reflection is prevented.

However, as in the first prior art, forming an uneven surface having asperities on the substrate and forming light-emitting device on the uneven surface does not necessarily improve the extraction efficiency. Depending on the shapes of the asperities, the amount of light extracted from the light exit surface is decreased compared to a case of a flat light-emitting apparatus on which no uneven surface is formed.

Also, depending on the shapes of the asperities, the following problems occur. That is, when forming light-emitting device on the uneven surface as shown in FIG. 23(a), the thickness of each of the layers forming the light-emitting device (particularly, a light-emitting layer) varies according to locations. Also, as shown in FIG. 23(b), electrodes 201, 221 could contact each other (for example, at a location E).

As shown in FIG. 23(a), a portion of a light-emitting layer 211 (for example, a portion C in the drawing) that is thinner than other portions (for example, a portion B) has a lower resistance and thus the current passes easily. This results in a higher brightness at the portion C compared to other portions (the portion B). A great amount of current at the thin portion C increases the temperature at the portion C. This further reduces the resistance at the portion C. Accordingly, a greater current passes through the portion C, and the brightness is further increased. Accordingly, the apparatus might have an uneven brightness. Further, the phenomenon causes a significant amount of current to pass through specific portions of the light-emitting layer 211, and thus shortens the lifetime of these portions. As a result, the lifetime of the apparatus is shortened.

If a portion where no light-emitting layer 211 exists (for example, a portion E in the drawing) as shown in FIG. 23(b), a significant amount of current passes through such a portion. Thus, the amount of current that passes through the light-emitting layer 211 is decreased, for example, in a portion D. As a result, sufficient brightness cannot be obtained.

Further, a light-emitting apparatus is required to have a high brightness in a specific direction. This is because a user using or viewing a light-emitting apparatus is typically views the apparatus from a particular direction in relation to the apparatus (generally, in a normal direction of a light extraction side, or a light exit surface, of the apparatus).

On the other hand, when a light-emitting apparatus is used as a reflection plate as in the third prior art, the brightness of reflected light in a specific direction needs to be increased in addition to preventing specular reflection. FIG. 24 illustrates a case where a light-emitting apparatus is used as a backlight of a liquid crystal display unit 8 under a light source 9, which is, for example, the sun or a fluorescent tube. In this case, when light from the light source 9 reaches the display unit 8 along a direction shifted from the normal H to a display surface 80 by an angle θ (the angle θ is approximately 20° to 40°, and preferably, is approximately 30°), not only specular reflection needs to be prevented, but also, the brightness in the direction of the normal H to the display surface 80, or in a direction where the angle θ is approximately 0°, needs to be increased.

SUMMARY OF THE INVENTION

Accordingly, it is a first objective of the present invention to provide a light-emitting apparatus that emits substantially a greater amount of light from a light extraction side and has less brightness unevenness than a light-emitting apparatus with no uneven surface. The present invention also pertains to a method for forming such an apparatus.

It is a second objective of the present invention to provide a light-emitting apparatus that has a high brightness in a specific direction at a light exit side and a method for forming such an apparatus.

Further, a third objective of the present invention is to provide a light-emitting apparatus that, when used as a reflection plate, not only prevents specular reflection, but also has a high brightness in a specific direction when receiving light in a direction of an hypothetical light source. The present invention also pertains to a method for forming such an apparatus.

To achieve the above-mentioned objective, the present invention provides a light-emitting apparatus. The apparatus includes a substrate and a light-emitting device provided on the substrate. The device includes a light-emitting layer located between a pair of electrodes. A face of the substrate on which the light-emitting device is formed is an uneven surface having a plurality of asperities. The mean spacing Sm of adjacent asperities or the mean spacing S of peaks of adjacent projections of the asperities is no less than three times the longest wavelength of light generated by the light-emitting layer and no more than two hundred times the longest wavelength. At least one of the following requirements (i)–(vi) is satisfied.

(i) The arithmetic mean slope $\Delta a$ of the uneven surface is in a range between 4° and 30°, inclusive.

(ii) The root mean square slope $\Delta q$ of the uneven surface is in a range between 4° and 35°.

(iii) The ratio Ra/Sm of the arithmetic mean roughness Ra of the uneven surface to the mean spacing Sm of asperities is in a range between 0.008 and 0.09, inclusive.

(iv) The ratio Ra/S of the arithmetic mean roughness Ra to the mean spacing S of peaks is in a range between 0.009 and 0.10, inclusive.

(v) The ratio Rz/Sm of the ten-point height of irregularities Rz of the uneven surface to the mean spacing Sm of asperities is in a range between 0.05 and 0.22, inclusive.

(vi) The ratio Rz/S of the ten-point height of irregularities Rz to the mean spacing S of peaks is in a range between 0.05 and 0.25, inclusive.

According to another aspect of the invention, a method for manufacturing a light-emitting apparatus having a light-emitting layer is provided. The method includes steps of preparing a substrate, forming a plurality of asperities on a face of the substrate. The mean spacing Sm of adjacent asperities or the mean spacing S of peaks of adjacent projections of the asperities is no less than three times the longest wavelength of light generated by the light-emitting layer and no more than two hundred times the longest wavelength. The uneven surface is formed such that at least one of the above requirements (i)–(vi) is satisfied. The method further includes a step of forming on the uneven surface a light-emitting device having the light-emitting layer and a pair of electrodes between which the light-emitting layer is located such that the light-emitting device is curved along the uneven surface.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
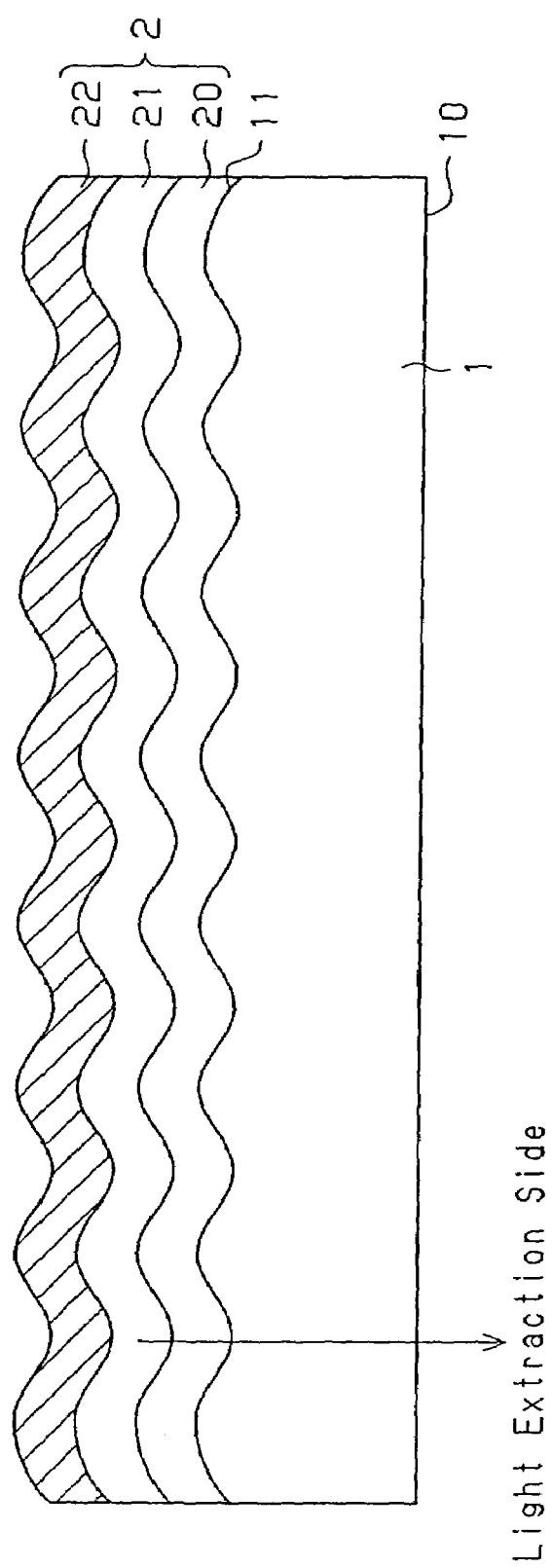
FIG. 1 is a cross-sectional view illustrating a first organic EL apparatus according to one embodiment of the present invention.

Several embodiments of the present invention will now be described with reference to the drawings. Same reference numerals are similar or the same in the drawings. A first organic EL apparatus will now be described.

As shown in FIG. 1, the first organic EL apparatus is of a bottom emission type that includes a transparent substrate 1 and an organic EL device 2. Asperities are formed on one face of the transparent substrate 1 (a incident surface 11). In other words, the incident surface 11 is an uneven surface. The organic EL device 2 is formed on the incident surface 11.

<Substrate 1>

The substrate 1 is a substantially plate-shaped transparent member that supports the organic EL device 2. The substrate 1 has the incident surface 11 on which the organic EL device 2 is formed, and a light exit surface 10 that is located opposite from the incident surface 11. The substrate 1 receives light from the organic EL device 2 through the incident surface 11, and emits the received light through the light exit surface 10.

The first organic EL apparatus has asperities, or projections and depressions, on the incident surface 11, and is characterized in that the arithmetic mean slope $\Delta a$ of the incident surface 11 is in a range between 4° and 30°, inclusive.

To improve the reflection properties of the organic EL apparatus to a favorable level, the arithmetic mean slope $\Delta a$ of the incident surface 11 is preferably in a range between 4° and 15°, inclusive.

The arithmetic mean slope $\Delta a$ is specified in JIS B0601-1994. The arithmetic mean slope $\Delta a$ is computed in the following manner. First, a measured curve is divided along a mean line into sections each of which has a length of $\Delta X$. Then, the absolute value of the inclination angle of a line segment of each section, which line segment connects the starting point and the endpoint of the section, is obtained. Thereafter, a mean value of the obtained absolute values is computed. That is, the arithmetic mean slope $\Delta a$ is computed using the following equation.

$$\Delta a = \frac{1}{n-1} \sum_{i=1}^{n-1} \left\{ \tan^{-1}\left|\left(\frac{\Delta Y i}{\Delta X}\right)\right| \right\}$$

In this equation, the inclination angle is expressed as follows.

$$\tan^{-1}\frac{\Delta Y i}{\Delta X}$$

As long as the organic EL device 2 can be formed on and supported by the substrate 1 and the substrate 1 is transparent, the substrate 1 may be made of any material. Typically, the substrate 1 is made of glass, quartz, or plastic. Alternatively, the substrate 1 may be formed by combining two or more substrates of the same types or different types.

In this specification, the term "transparent" refers to a state in which the transmittance of light that exits the apparatus is no less than 50%, preferably no less than 80%, and most preferably no less than 90%. Typically, the transparency is determined so that light, the wavelength of which is approximately 400 nm to 800 nm (visible light), exits the apparatus. If the transmittance is too low, light emitted from a light-emitting layer is attenuated, and a required brightness as the light-emitting apparatus can hardly obtained.

The uneven surface (the incident surface 11) is designed to satisfy the following requirements (a) or (b).

This is because, if Sm or S is set no less than the following lower limit values, simulations of geometrical optics can be performed, which significantly facilitates the design of the optical properties of the organic EL apparatus.

If Sm or S is more than the following upper limit values, the incident surface 11 is thought to be optically flat. In this case, the incident surface 11 is substantially in the same conditions as a case where no asperities are formed thereon.

(a) The mean spacing Sm of adjacent asperities is no less than three times the longest wavelength of the light generated by the light-emitting layer and no more than two hundred times the longest wavelength.

(b) The mean spacing S of peaks of adjacent projections of the asperities is no less than three times the longest wavelength of the light generated by the light-emitting layer and no more than two hundred times the longest wavelength.

The mean spacing Sm of adjacent asperities is specified in JIS B0601-1994. The mean spacing Sm of asperities is computed in the following manner. First, a section that corresponds to a referential length L is chosen from a roughness curve along a direction of a mean line. Then, with respect to the direction along which the mean line extends, a distance Smi of each peak and an adjacent valley is obtained. Thereafter, a mean value of the distances Smi is computed and expressed in millimeters. That is, the mean spacing Sm of asperities is computed using the following equation.

$$Sm = \frac{1}{n}\sum_{i=1}^{n} Smi$$

The mean spacing S of peaks of adjacent projections of the asperities is specified in JIS B0601-1994. The mean spacing S of peaks is computed in the following manner.

First, a section that corresponds to a referential length L is chosen from a roughness curve along a direction of a mean line. Then, with respect to the direction along which the mean line extends, a distance Si between each adjacent pair of the peaks is obtained. Thereafter, a mean value of the distances Si is computed and expressed in millimeters. That is, the mean spacing S of peaks is computed using the following equation.

$$S = \frac{1}{n}\sum_{i=1}^{n} Si$$

The inventors of the present invention found out that the above ranges of the values are preferable for organic EL apparatus through the following examples and comparison examples.

In the examples and the comparison examples, organic EL apparatuses were made while varying the arithmetic mean slope Δa of the incident surface 11 in a range greater than 0° up to 30°. Other conditions including the materials, the film thicknesses, and the formulae were the same. The process for making the organic EL apparatuses of the examples and the comparison examples will now be described.

Plate-shaped transparent substrates each of which has an incident surface and a light exit surface were prepared. Using masks, photoresist was formed on the incident surface of each substrate. The photoresist was applied to define a pattern corresponding to projections to be formed with reference to the light exit surface. In this state, the incident surface was etched. Consequently, the incident surface 11 having asperities was completed. After the incident surface 11 was formed, the arithmetic mean slope Δa of the incident surface 11 was measured with a roughness meter.

After measuring the arithmetic mean slope Δa, a transparent electrode, or the first electrode 20 having a thickness of 50 nm, was formed of ITO on the incident surface 11 through the RF sputtering. After forming the first electrode 20, an organic light-emitting layer 21 was formed with a vacuum deposition apparatus, or a carbon crucible. At this time, the deposition speed was 0.1 nm/s, and the degree of vacuum was $5.0 \times 10^{-5}$ Pa. The formed organic light-emitting layer 21 included a hole injection transport layer, a layer that contains an organic light-emitting material, and an electron injection transport layer. The hole injection transport layer was formed of TPTE and the thickness was 80 nm. The organic light-emitting material containing layer was formed by co-depositing DPVBi (93.0 weight %) and BCzVBi (7.0 weight %), and the thickness was 30 nm. The electron injection transport layer was formed of 2,5-bis(6'-(2',2''-bipyridyl))-1,1-dimethyl-3,4-diphenylsilole, and the thickness was 20 nm. Thereafter, an aluminum layer (second electrode) 22 having a thickness of 150 nm was formed with a tungsten boat. At this time, the deposition speed was 1 nm/s, and the degree of vacuum was $5.0 \times 10^{-5}$ Pa. The organic EL apparatus was thus completed. Each organic EL apparatus was sealed with a conventional protective film (passivation film).

[Evaluation 1]

Figure 2:
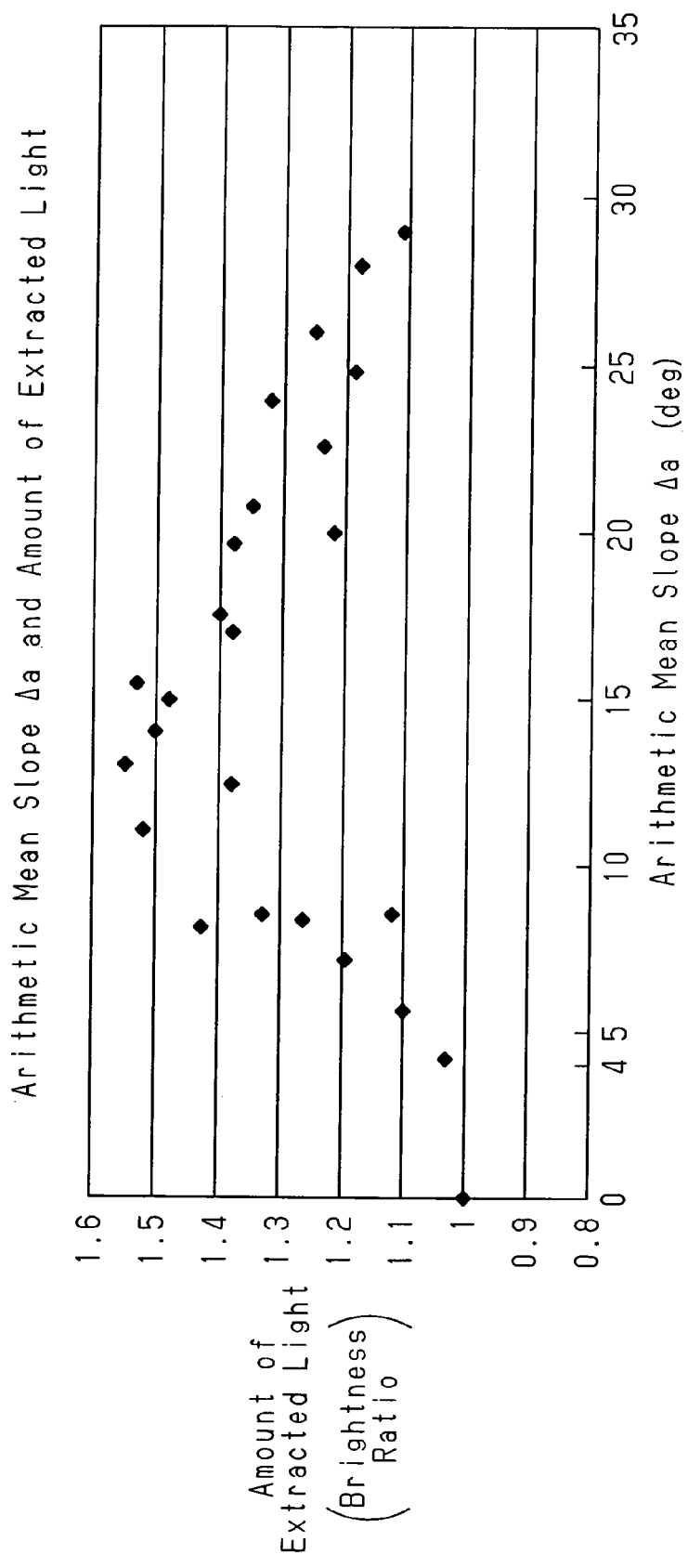
FIG. 2 is a graph representing an example and a comparison example of the first organic EL apparatus, showing the relationship between the arithmetic mean slope $\Delta a$ and the brightness.

The same current was applied to each of the formed organic EL apparatuses, and the total amount of light emitted from each of the light exit surface 10 was measured with a brightness meter. The relationship between the arithmetic mean slope Δa of the incident surface 11 and the brightness of the organic EL apparatuses is shown in the graph of FIG. 2. The brightness is expressed as a ratio (brightness ratio) to the brightness of an organic EL apparatus that has an organic EL device 2 formed in the same manner as described above but has no asperities on the incident surface 11. The brightness of the referential organic EL apparatus is plotted on a position where the arithmetic mean slope Δa is 0°.

The inventors found out from the experiment results of FIG. 2 that if Δa is equal to or greater than 4°, the amount of light that exits through the light exit surface 10 is greater than that of a conventional organic EL apparatus having a flat incident surface.

In other words, the inventors found out that simply providing asperities on the incident surface could result in decreasing the amount of light that exits through the light exit surface compared to conventional organic EL apparatuses.

[Evaluation 2]

Figure 3:
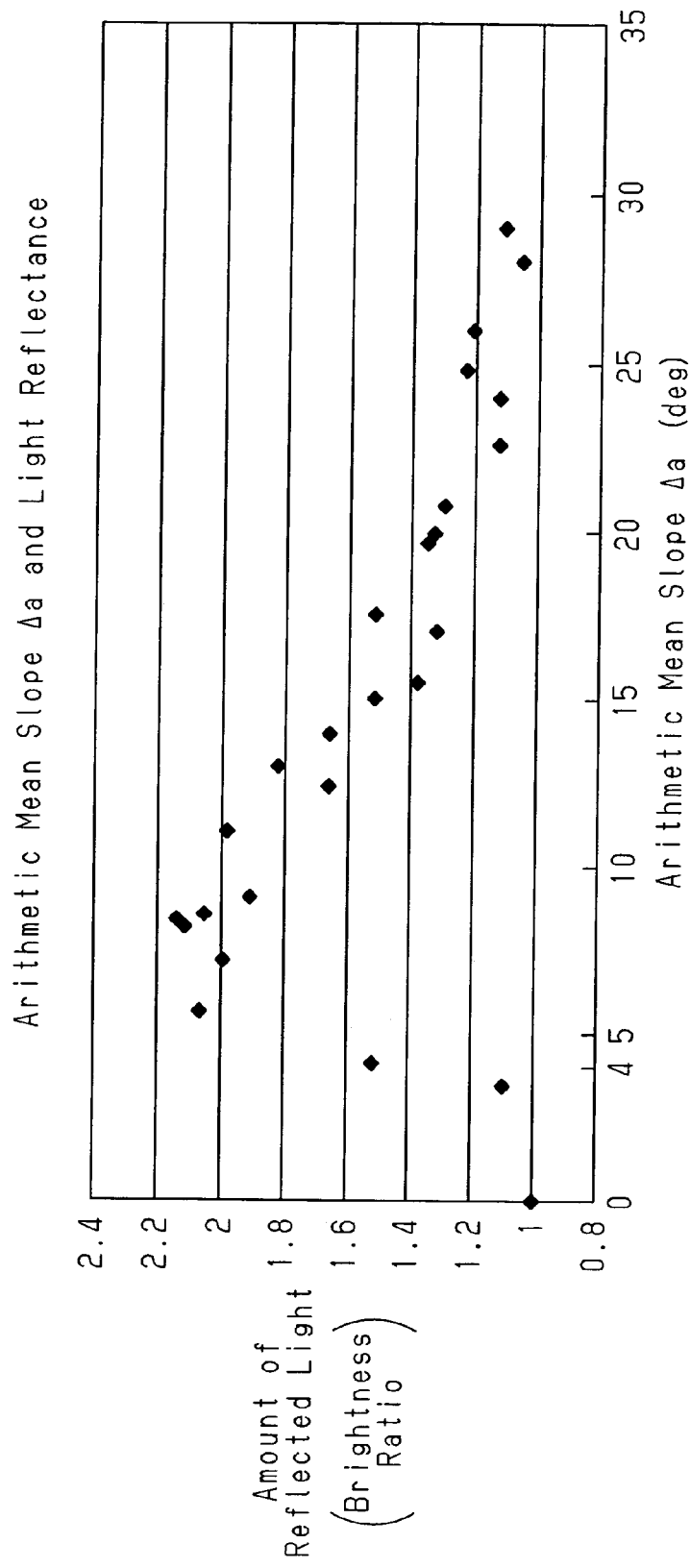
FIG. 3 is a graph representing an example and a comparison example of the first organic EL apparatus, showing the relationship between the arithmetic mean slope $\Delta a$ and the brightness in a normal direction of a light exit surface when light is applied from a position in a direction shifted from the normal direction of the light exit surface by 30°.

Without activating the organic EL device 2 to emit light, light was applied to each organic EL apparatus from a light source at a position shifted by 30° from the normal direction of the light exit surface 10. That is, the 30° incident light was applied to each organic EL apparatus, and the brightness in the normal direction of the light exit surface 10, or the brightness of the reflected light in the normal direction of the light exit surface was measured with the brightness meter. The relationship between the arithmetic mean slope Δa of the incident surface 11 and the brightness of the reflected light in the normal direction of the light exit surface is shown in the graph of FIG. 3. The brightness is expressed as a ratio (brightness ratio) to the brightness in the direction of the normal of an organic EL apparatus that has an organic EL device 2 formed in the same manner as described above but has no asperities on the incident surface 11. As in the case of FIG. 2, the brightness of the referential organic EL apparatus is plotted on a position where the arithmetic mean slope Δa is The inventors found out from the experiment results of FIG. 3 that, if the Δa is in a range between 4° and 15°, inclusive, the ratio of the reflected light in the normal direction of the light exit surface to the 30° incident light is no less than 1.5 times that of a conventional organic EL apparatus having a flat incident surface. That is, the inventors found out that, compared to cases where the Δa is less than 4 or is more than 15°, the ratio of the reflected light is significantly increased.

The inventors also found out that, if Δa is in a range greater than 0° up to 30°, the amount of the reflected light in the normal direction of the light exit surface among the 30° incident light is greater than that of a case where no asperities are formed on the incident surface 11.

Further, the inventors found out that, unlike the case of conventional organic EL apparatuses having no asperities on the incident surface, there was no specular reflection in the organic EL apparatus in which Δa is in a range greater than 0° up to 30°.

The inventors also found out that if a constant light is applied from a position shifted by an angle that is in a range of 20° to 40° relative to the normal direction of the light exit surface 10, the same advantages are obtained.

[Evaluation 3]

Also, three organic EL apparatuses each of which has an organic EL device 2 formed in the same manner as described above were formed while varying Δa to 35°, 40°, and 45°. Brightness unevenness was visually observed in these EL apparatuses when activated. On the other hand, in the organic EL apparatus Δa of which is greater than 0° and no more than 30°, no brightness unevenness was visually observed when the EL apparatus was activated to emit light under the same conditions as the other EL apparatuses Δa of which were 35°, 40°, and 45°.

The above results are considered to be caused by the fact that, if Δa of a incident surface 11 is greater than 30°, it is difficult to form an organic EL device 2 having an even thickness, particularly an organic light-emitting layer 21 having an even thickness, over the entire surface of a substrate 1. That is, since the organic light-emitting layer 21 has thick portions and thin portions, the brightness at the thin portions is increased, which results in brightness unevenness. Also, asperities having steep slopes Δa of which is greater than 30° create portions where no organic light-emitting layer 21 is formed, which causes leakage between the electrodes.

In other words, the inventors found out that simply providing asperities on the incident surface 11 could result in creating brightness unevenness or leakage between electrodes, and, on the other hand, that, if Δa is set in the above mentioned range, no brightness unevenness nor leakage occur.

The organic EL device 2 of the first organic EL apparatus will now be described.

As shown in FIG. 1, the organic EL device 2 has a pair of electrodes 20, 22, and an organic light-emitting layer 21 held between the electrodes 20, 22. The light-emitting layer 21 contains organic light-emitting material. The organic EL device 2 emits light of a predetermined color (light of a predetermined wavelength or light of a predetermined chromaticity). Since the organic EL device 2 of the first organic EL apparatus is the same as the conventional organic EL device except that the organic EL device 2 is provided along the asperities of the incident surface 11 on the substrate 1, a conventional organic EL device can be used for the organic EL device 2.

[First Electrode 20]

Since the first electrode 20 of the first organic EL apparatus, which is the bottom emission type, is formed on the light extraction side with respect to the organic light-emitting layer 21, the first electrode 20 needs to be transparent. The first electrode 20 may be anode or cathode. The material for the first electrode 20 (transparent electrode) is preferably a material that permits carrier (holes or electrons) to be efficiently injected into the organic light-emitting layer 21.

As the anode, a material the work function of which is 4.5 eV to 5.5 eV is favorable. Specifically, a material having any one of indium tin oxide (ITO), indium zinc oxide (IZO), indium oxide ($In_2O_3$), tin oxide ($SnO_2$), and zinc oxide (ZnO) as a main component is favorable.

These oxides may be more or less biased from the stoichiometry. The preferable range of the mixing ratio of $SnO_2$ relative to $In_2O_3$ in ITO is for example 1 to 20 wt %, and preferably 5 to 12 wt %. The preferable range of the mixing ratio of ZnO relative to $In_2O_3$ in IZO is for example 12 to 32 wt %. Further, if the average mixing ratio is in these ranges in the entire transparent first electrode, a concentration gradient may exist in the thickness direction.

Other than the components listed above, oxides of Sn, Ti, and Pb may be contained in the material of the anode at 1 wt % in terms of oxide.

The cathode is an electrode for injecting electrons in the organic layer. To increase the efficiency of the electron injection, a metal, an alloy, an electroconductive compound, and a mixture of these having a work function that is less than 4.5 eV, generally no more than 4.0 eV, typically no more than 3.7 eV, is used as the material for the electrode.

The materials listed for the anode may be used for the cathode. Also, the following materials may be used.

For example, an electrode made by laminating a transparent conductive oxide on a super thin film made of a magnesium-silver alloy may be used. In the cathode, a buffer layer containing copper phthalocyanine is preferably provided between the cathode and the organic light-emitting layer 21 to prevent the light-emitting layer 21 and other components from being damaged by plasma when sputtering the conductive oxide.

[Organic Light-emitting Layer 21]

The organic light-emitting layer 21 permits recombination of the carriers (electrons or holes) from at least one of the first electrode 20 and the second electrode 22, generates excitons, and causes the excitons to emit electroluminescence (light) when returning to the ground state. The organic light-emitting layer 21 is mainly made of an organic material.

An organic material that gives more than required functions to the organic light-emitting layer 21 may be used. Also, several materials each giving different functions to the light-emitting layer 21 may be used. As these materials, materials used for the organic light-emitting layer of a conventional organic EL device, such as Alq3 or DCM, may be used.

Further, the organic light-emitting layer 21 may have a laminated structure, and each layer may have one of the required functions. In this case, a layer that contains fluorescent material or phosphorescent material (organic light-emitting material) that generates electroluminescence is referred to as an organic light-emitting material containing layer.

For example, an electron injection layer having an electron injection function from the cathode or an electron injection transport layer may be provided between the cathode and the organic light-emitting material containing layer. An electron transport layer having an electron transporting function may be provided between the organic light-emitting material containing layer and the cathode or between the organic light-emitting material containing layer and the electron injection layer. A hole injection layer having a function to inject holes from the anode or a hole injection transport layer may be provided. Alternatively, a hole transport layer having a hole transport function may be provided.

A layer configuration and materials that are the same as those of a conventional organic EL device may be adopted.

The color of emitted light can be adjusted in the same manner as the method for adjusting color of light in conventional organic EL devices. For example, the following adjusting method may be employed.

Selection of types of the material (organic light-emitting material) that gives the organic light-emitting layer 21 a function for generating electroluminescence when returning from a state of excitons to the ground state.

Adjustment of the mixing ratio of an organic material or an organic light-emitting material added to the organic light-emitting layer 21.

Adjustment of the amount of mixed organic light-emitting material.

Adjustment of the thickness of the organic light-emitting layer 21.

Providing a conventional color filter layer on the organic EL apparatus to limit the wavelength of light that exits the apparatus.

Adding a color changing material that changes the wavelength of received light.

Two or more types of organic light-emitting materials are mixed so that two or more colors are generated, thereby expressing additive color.

Adding a material that promotes or hinders light-emitting to adjust the color of the generated light.

Adjusting the color of the generated light by the amount of current supplied to the organic light-emitting layer 21.

[Second Electrode 22]

If the first electrode 20 is an anode, the second electrode 22 is a cathode. If the first electrode 20 is a cathode, the second electrode 22 is an anode. Therefore, materials that are used for conventional organic EL devices and satisfy the requirements for an anode or cathode may be employed. Thus, the materials for the first electrode 20 may be employed for the second electrode 22.

However, since the second electrode 22 preferably increases the extraction efficiency of the apparatus by reflecting light emitted to the side opposite from the light extraction side toward the light extraction side, and reflects light received through the light extraction side when the organic EL device 2 is not emitting light, the second electrode 22 has preferably a reflecting function. When adding a reflecting function to the second electrode 22, a metal or an alloy used in conventional organic EL device may be employed. Specifically, the material for the second electrode 22 is required to have the following properties in addition to the properties required as an anode or a cathode. That is, among the entire wavelength range of the light from the organic light-emitting layer 21 and the light applied from the outside of the apparatus, the material needs to at least reflect light of a wavelength range to be extracted from the light exit surface 10 to the outside of the apparatus.

Also, layers and materials of conventional organic EL devices other than the ones listed above may be employed in combination. For example, without adding light reflecting function to the second electrode 22, a light reflecting member may be provided on a side of the organic light-emitting layer 21 that is opposite from the light extraction side. Also, a semitransparent reflective member (half-mirror) may be provided in the organic EL device 2.

A method for forming the first organic EL apparatus will now be described.

<Forming Method>

The first organic EL apparatus is formed through a conventional method for forming substrates, and a conventional method for forming organic EL devices. In the substrate forming method, asperities satisfying the above mentioned conditions are formed on the incident surface 11 of the substrate 1. In the organic EL device making method, layers forming the organic EL device 2 are successively formed on the incident surface 11. For example, the first organic EL apparatus may be formed in the following manner.

Figure 4A:
FIGS. 4(a) to 4(c) are cross-sectional views illustrating a process for forming the first organic EL apparatus shown in FIG. 1.
Figure 4B:
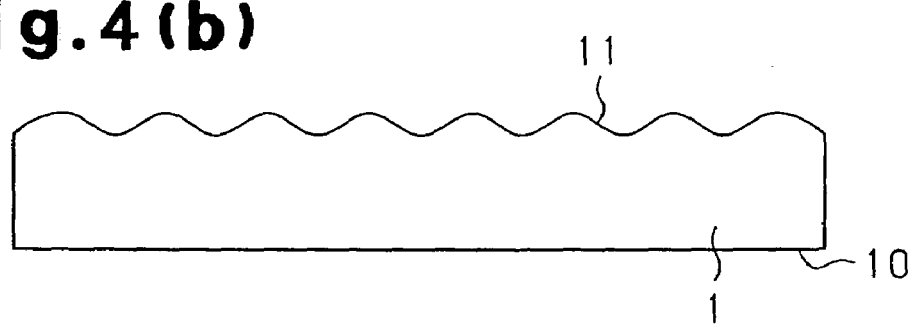

First, a plate-shaped transparent substrate 1' shown in FIG. 4(a) is prepared. To one of the sides (incident surface) 11' of the transparent substrate 1', a mask the pattern of which corresponds to the arrangement of the depressions and projections to be formed is applied. Then, using the mask, photoresist is formed on the surface to form a pattern. In this state, the transparent substrate 1' is etched so that an uneven surface 11 is formed as shown in FIG. 4(b).

Figure 4C:
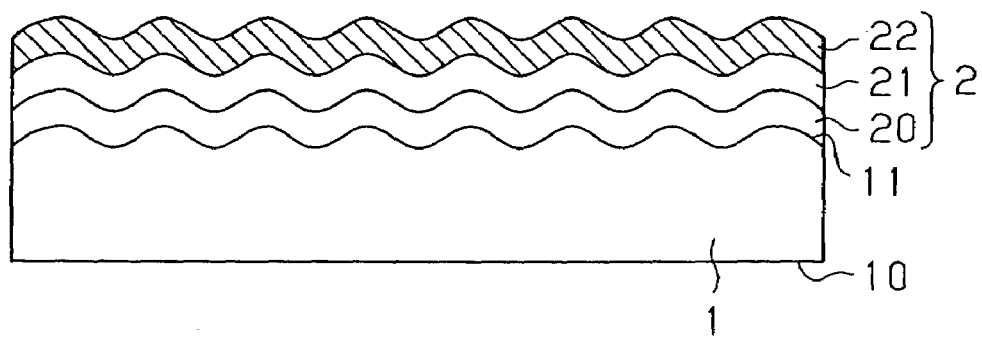

Then, as shown in FIG. 4(c), on the incident surface 11 of the transparent substrate 1, the first electrode 20 is formed to have depressions and projections conforming to the incident surface 11. The organic light-emitting layer 21 and the second electrode 22 are also successively formed on the first electrode 20 so that each layer has depressions and projections conforming to a layer underneath. Since each layer is formed to have a uniform thickness, each layer has a curved shape conforming to the incident surface 11 of the transparent substrate 1. The laminating method for forming layers on the conventional organic EL device may be employed. For example, a conventional method for forming thin films, such as vacuum deposition, sputtering, spin coating, casting, and the LB method may be employed.

The organic EL apparatus is formed in the above-described manner.

Instead of etching the incident surface 11, other method for processing substrates may be employed. For example, a surface treatment of the sandblasting may be employed. Alternatively, a mold having an inner surface with asperities may be used. In this case, molten transparent resin or glass is poured into the mold to form the substrate 1 having the incident surface 11.

<Advantages>

The organic EL apparatus according to this embodiment, which has the above-described configurations, has the following advantages.

High Extraction Efficiency and Significantly Low Incidence of Brightness Unevenness Since the incident surface 11 has the above-described configurations, the incident surface 11 has a higher extraction efficiency compared to a conventional organic EL apparatus with a flat incident surface. Also, the incidence of the occurrence of brightness unevenness is significantly low.

In other words, the incident surface 11 has a performance that cannot be obtained by simply forming the asperities on an incident surface.

Improvement of Brightness in Specific Direction

It has been confirmed that, when the organic EL apparatus of the above embodiment emits light, the brightness in a specific direction with respect to the light exit surface 10 is greater than the brightness in other directions. Also, it has been confirmed that the specific direction is changed by altering $\Delta a$.

Such changes of the brightness are considered to be due to light collecting properties of the depressions, and to reflection and refraction by the depressions and the projections.

Therefore, the organic EL apparatus according this embodiment is suitable for a display, a lighting system and a backlight of a liquid crystal display unit, which are required to have in specific directions compared to in other directions.

Great Amount of Emitted Light

Since the organic EL device 2 is formed along the asperities on the uneven incident surface 11, the amount of the organic light-emitting layer 21 (light-emitting area) is increased compared to a conventional organic EL apparatus having a flat incident surface. Accordingly, the amount of emitted light is increased.

Also, since the arithmetic mean slope $\Delta a$ is set in the above described range, the possibility that portions where the organic light-emitting layer 21 does not exist is significantly reduced. In other words, the possibility that portions where current leakage occurs between the electrode 20, 22 are created is significantly reduced. Accordingly, a great portion of current supplied to the organic EL device 2 passes through the organic light-emitting layer 21, and the luminous efficiency is improved.

Improvement of Reflection Property

When used as a reflection plate, the organic EL apparatus, which is designed as described above, has an advantage. That is, when reflecting light from a light source in a direction shifted from the normal direction of the light exit surface 10 by 20° to 40° (generally, 30°), the apparatus reflects a great portion of the applied light in a normal direction of the light exit surface 10.

Since the minute asperities are formed on the incident surface 11 and each layer in the organic EL device 2, the specular reflection is prevented.

Improvement of Chromaticity Property

When the apparatus emits light, the chromaticity is uniform in all light-emitting directions from the light exit surface 10.

This is because since the minute asperities are formed in the incident surface 11 and each layer in the organic EL device 2, light of each wavelength is diffused in various directions, and, in the light-emitting directions from the light exit surface 10, the dependence of the brightness of light of each wavelength to the angle is significantly reduced.

The first organic EL apparatus may be modified as follows. Also, two or more of the following modifications may be combined.

Figure 5:
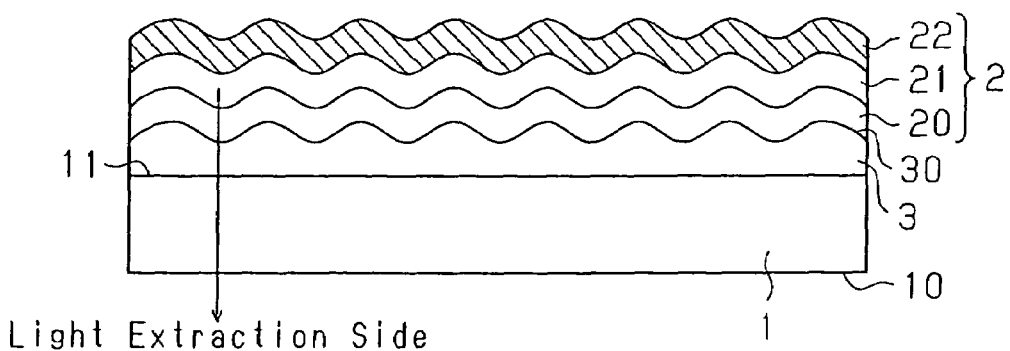
FIG. 5 is a cross-sectional view illustrating a modification of the first organic EL apparatus shown in FIG. 1.

In modification 1, asperities are formed in a middle layer. That is, as shown in FIG. 5, a middle layer 3 having an uneven surface 30 is formed between the substrate 1 and the organic EL device 2. Instead of forming asperities on the incident surface 11 of the substrate 1, asperities are formed on the uneven surface 30. The arithmetic mean slope Δa of the asperities on the uneven surface 30 is in a range between 4° and 30°, inclusive, and the organic EL device 2 is formed along the uneven surface 30. This modification has the same advantages as the above embodiment.

If the arithmetic mean slope Δa is in a range between 4° and 15°, inclusive, the light reflection property is improved to a satisfactory level.

In this modification, the uneven surface 30 is designed to satisfy the requirements (a) or (b) for the reasons listed above.

Figure 6A:
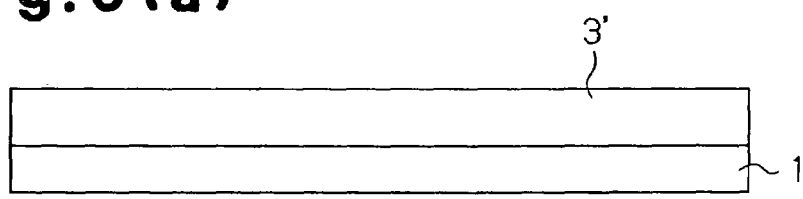
FIGS. 6(a) to 6(c) are cross-sectional views illustrating a process for forming the organic EL apparatus shown in FIG. 5.
Figure 6B:
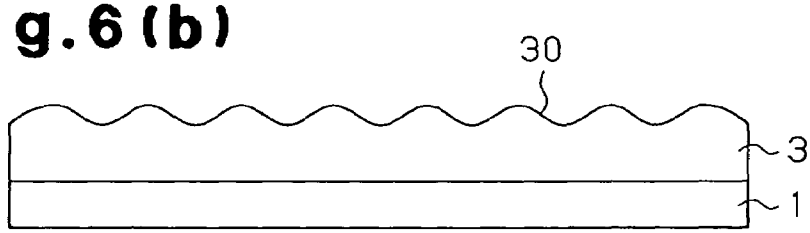

The organic EL apparatus of this modification may be formed, for example, in the following manner. As shown in FIG. 6(a), a transparent middle layer 3' having a predetermined thickness is formed on the surface of a plate-shaped transparent substrate 1'. To the surface of the middle layer 3', a mask the pattern of which corresponds to the arrangement of the depressions and projections to be formed is applied. Then, using the mask, photoresist is formed on the surface to form a pattern. In this state, the middle layer 3' is etched so that an uneven surface 30 is formed as shown in FIG. 6(b).

Figure 6C:
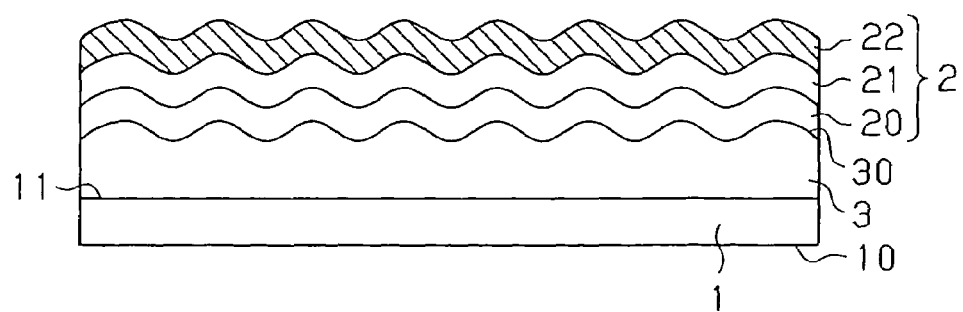

Then, as shown in FIG. 6(c), on the uneven surface 30, the first electrode 20, which is a transparent electrode of a uniform thickness, is formed. On the first electrode 20, the organic light-emitting layer 21 having a uniform thickness is formed. On the organic light-emitting layer 21, the second electrode 22, which is a reflective electrode having a uniform thickness, is formed. At this time, each layer is formed to have asperities that conform to the asperities on a layer underneath (the middle layer 3 or a layer closer to the middle layer 3). Since each layer is formed to have a uniform thickness, each layer has a curved shape conforming to the uneven surface 30 of the middle layer 3. In this manner, the organic EL apparatus shown in FIG. 5 is formed.

Instead of forming the middle layer 3 through etching as described above, the middle layer 3 may be formed through photolithography using half exposure and focus offset. That is, the middle layer 3 may be made of photoresist.

Further, instead of forming the uneven surface 30 of the middle layer 3 through etching, the uneven surface 30 may be formed through a surface treatment by sandblasting.

Also, a transparent sheet that is made, for example, of resin and has asperities may be adhered to the transparent substrate 1 to form the middle layer 3. In the above modification, the asperities are formed on the surface of the transparent layer 3 that is formed on the transparent substrate 1 and first has an even thickness. Instead, asperities may be formed through the following method. That is, a transparent film is first formed only on portions of the transparent substrate 1 that correspond to the projections to be formed. Then, another transparent film is formed on the entire surface of the first transparent film and the transparent substrate 1. Accordingly, asperities are formed.

The middle layer 3 may be made of any material as long as the material is transparent when formed into the middle layer 3, has a high adhesion property with the substrate 1 and the organic EL device 2 (the first electrode 20), and exerts little chemical and physical influence to the organic EL device 2 and the substrate 1. For example, the middle layer 3 may be made of a polyester resin or an acrylic resin.

Also, the middle layer 3 may have functions other than the function for forming the uneven surface 30. For example, the refractive index of the middle layer 3 may have an intermediate value between those of the organic EL device (the first electrode 20) and the transparent substrate 1. In this case, the amount of light that enters the transparent substrate 1 from the organic EL device 2 increases compared to an organic EL apparatus that does not have the middle layer 3. A wavelength converting material may be contained in the middle layer 3. Also, a scattering member may be embedded in the middle layer 3.

If added to the organic EL device 2 (particularly, to the organic light-emitting layer 21), some additives will change the light-emitting properties of the organic EL device 2. These additives therefore cannot be used in conventional organic EL apparatuses. However, if the middle layer 3 is made of a material that has resistance to such additives, the additives can be added to the middle layer 3.

Further, forming the middle layer 3 permits a substrate 1 on which asperities are difficult or impossible to form to be used for a light-emitting apparatus.

Figure 7:
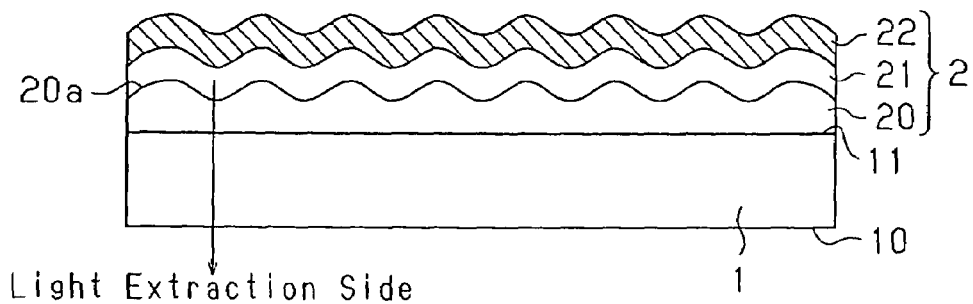
FIG. 7 is a cross-sectional view illustrating another modification of the first organic EL apparatus.

In modification 2, asperities are formed on an electrode 20 at the light extraction side rather than on the light-emitting layer 21. That is, as shown in FIG. 7, instead of forming asperities on the incident surface 11 of the substrate 1, an uneven surface 20a having asperities is formed on the electrode 20 provided adjacent to the substrate 1, that is, on a side of the first electrode 20 that is adjacent to the organic light-emitting layer 21. The arithmetic mean slope Δa of the asperities on the uneven surface 20a is in a range between 4° and 30°, inclusive. The organic light-emitting layer 21 and the second electrode (the other electrode) 22 are formed along the asperities. This modification provides the same advantages as the above embodiment.

If the arithmetic mean slope Δa is in a range between 4° and 15°, inclusive, the light reflection property is improved to a satisfactory level.

In this modification, the uneven surface 20a are designed to satisfy the requirements (a) or (b) for the reasons listed above.

Figure 8A:
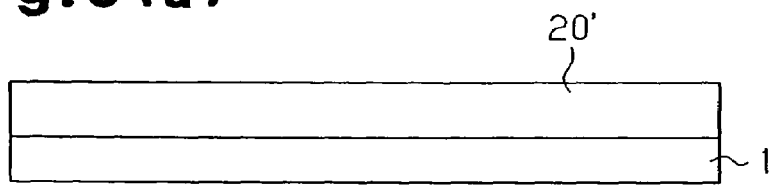
FIGS. 8(a) to 8(c) are cross-sectional views illustrating a process for forming the organic EL apparatus shown in FIG. 7.
Figure 8B:
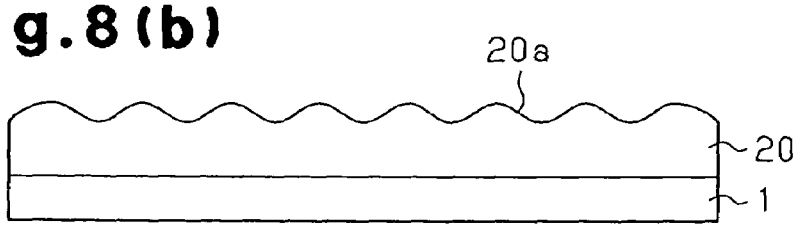

The organic EL apparatus of this modification may be formed, for example, in the following manner. As shown in FIG. 8(a), a transparent first electrode 20' having a predetermined thickness is formed on the surface of a plate-shaped transparent substrate 1. To the surface of the first electrode 20', a mask the pattern of which corresponds to the arrangement of the depressions and projections to be formed is applied. Then, using the mask, photoresist is formed on the surface to form a pattern. In this state, the first electrode 20' is etched so that an uneven surface 20a is formed as shown in FIG. 8(b).

Figure 8C:
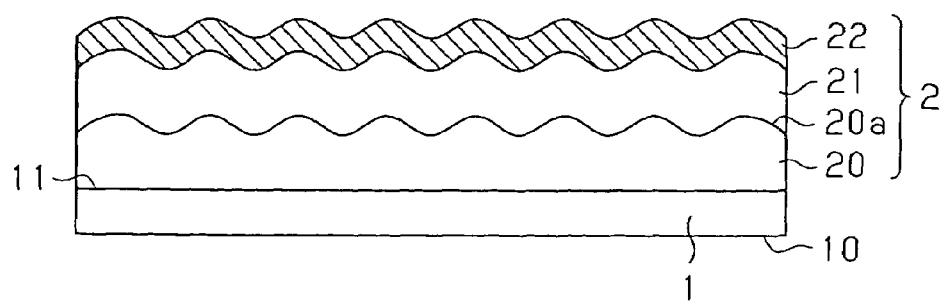

Then, as shown in FIG. 8(c), on the uneven surface 20a of the first electrode 20, the organic light-emitting layer 21 having a uniform thickness is formed. On the organic light-emitting layer 21, the second electrode 22, which is a transparent electrode having a uniform thickness, is formed. Accordingly, the organic light-emitting layer 21 and the second electrode 22 each of which has uneven surface are formed to conform to the surface of a layer underneath (the first electrode 20 or the light-emitting layer 21). Since each layer is formed to have a uniform thickness, each layer has a curved shape conforming to the uneven surface 20a of the first electrode 20. In this manner, the organic EL apparatus shown in FIG. 7 is formed.

Further, instead of forming the uneven surface 20a of the first electrode 20 through etching, the uneven surface 20a may be formed through a surface treatment by sandblasting.

In the preceding modification, the asperities are formed on the surface of the first electrode 20 that is formed on the transparent substrate 1 and has an even thickness. Instead, asperities may be formed through the following method. That is, a transparent film that is made of the material of a transparent electrode is first formed only on portions of the transparent substrate 1 that correspond to the projections to be formed. Then another transparent film of the same material is formed on the entire surface of the first transparent film and the transparent substrate 1. Accordingly, asperities are formed.

Further, instead of the transparent films, an electrode that has a lower specific resistance than the first electrode 20 and preferably is transparent or opaque may be used. This changes the potential in the surface of the first electrode 20 to a more equalized state, and thus significantly reduces brightness unevenness. Also, the resistance of the first electrode 20 is reduced.

Likewise, after the transparent electrode 20 having a uniform thickness is formed, an electrode that has a lower specific resistance than the transparent electrode and preferably is transparent or opaque may be formed to provide the uneven surface 20a. This significantly reduces brightness unevenness. Also, the resistance of the first electrode 20 is reduced.

Like the preceding modification, a substrate on which asperities are difficult to form may be employed.

Figure 9:
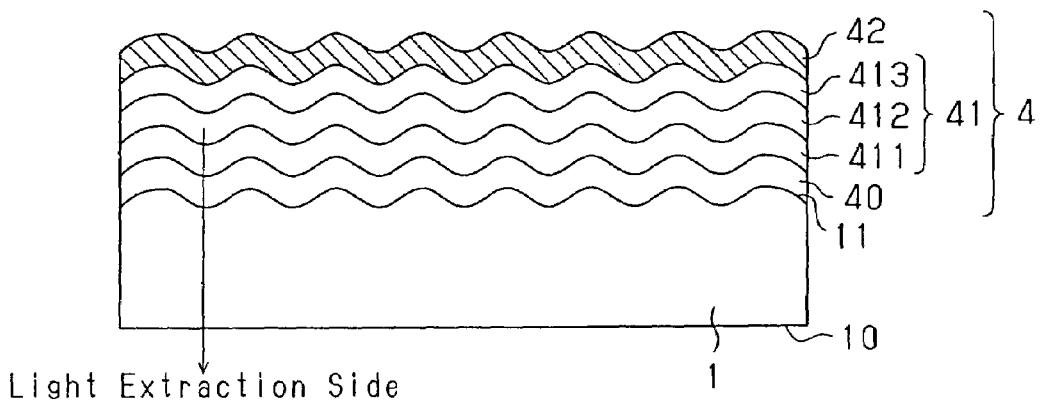
FIG. 9 is a cross-sectional view illustrating an example in which the configuration of the first EL apparatus is applied to an inorganic EL apparatus.

In modification 3, an inorganic EL device is employed. That is, in the above embodiment, the organic EL device 2 may be replaced by an inorganic EL device. As shown in FIG. 9, an inorganic EL device 4 includes an inorganic light-emitting layer 41 of a three-layer structure held between a transparent first electrode 40 and a second electrode 42, which is made, for example, of metal and functions as a reflective layer. The inorganic light-emitting layer 41 includes an inorganic light-emitting material containing layer 412 the main component of which is an inorganic material such as zinc sulfide. The inorganic light-emitting material containing layer 412 is held between a pair of insulating layers 411, 413 that are made, for example, of silicon oxide. When an alternating voltage about 200V is applied between the electrodes 40, 42, electrons emitted from the interfaces between the material containing layer 412 and the insulating layers 411, 413 are accelerated. This excites dopant atoms in the inorganic light-emitting layer 41 and thus produces light (electroluminescence). The light is then emitted from the device through the transparent electrode 40.

Figure 10:
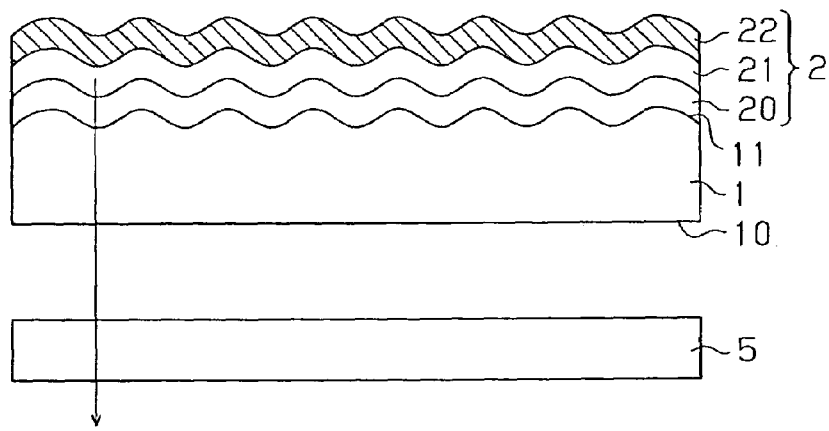
FIG. 10 is a cross-sectional view illustrating an apparatus (lighting system or a display) in which a prism sheet 5 is provided on a light extraction side of the first organic EL apparatus, and the brightness in a specific direction is increased.

In modification 4, a prism sheet is employed. That is, as shown in FIG. 10, a prism sheet 5 may be provided on a side corresponding to the light extraction side of the light-emitting layer 21. The number of the prism sheet 5 may be two or more.

As described above, the organic EL apparatus of this embodiment is capable of increasing the brightness in a specific direction in accordance with the arithmetic mean slope $\Delta a$ of the uneven surface. Therefore, if one or more prism sheets 5 that change the advancing direction of light emitted in the specific direction to the normal direction of the light exit surface 10 are provided on the light extraction side, the brightness in the normal direction of the light exit surface 10, or the frontward direction of the apparatus, is increased. As a matter of course, the apparatus may be designed to increase the brightness of a direction other than the frontward direction.

For the prism sheet 5, any of conventional sheets may be selected according to the light-emitting property of the organic EL apparatus. The selected prism sheet 5 is attached to the organic EL apparatus using any of conventional methods or conventional members.

In modification 5, the first organic EL apparatus is used as a backlight of a liquid crystal display unit. That is, the first organic EL apparatus can be used for a lighting system.

The first organic EL apparatus is suitable for a backlight (backlight source) of a liquid crystal display unit. This is because, compared to conventional organic EL apparatuses, the first organic EL apparatus emits a greater amount of light, has less brightness unevenness, has a higher reflection properties, and has no specular reflection as described above. Therefore, compared to a case where a conventional organic EL apparatus is used as a backlight of a liquid crystal display unit, using the first organic EL apparatus as a backlight increases the brightness, reduces the brightness unevenness, and permits displayed contents to be clearly visible when the apparatus is not emitting light.

Figure 11:
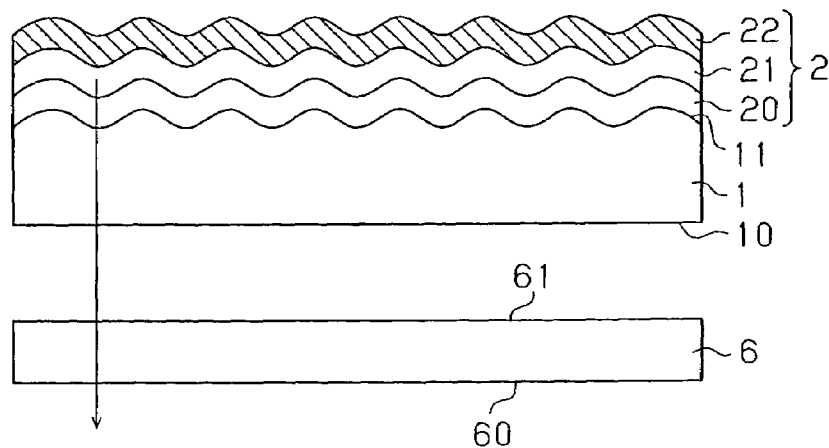
FIG. 11 is a cross-sectional view illustrating a liquid crystal display unit that has the first organic EL apparatus as a backlight.

For example, as shown in FIG. 11, the first organic EL apparatus may be used with a conventional transmissive or semitransparent liquid crystal display panel 6. The panel 6 is arranged so that a non-display face 61 faces the light exit surface 10. That is, the liquid crystal display panel 6 is arranged so that a display face 60 is visible from the outside of the liquid crystal display unit.

When the outside of the unit is sufficiently bright, display content of the liquid crystal panel 6 is clearly visible without activating the organic EL device 2. When the outside of the unit is not sufficiently bright, display content of the liquid crystal panel 6 is visible by activating the organic EL device 2.

In this manner, the display unit having the first organic EL apparatus as a backlight is capable of clearly displaying contents in a well lit place, for example, in the sunlight, and in a dark place, for example, in a room or at night. Also, when there is sufficient outside light, the organic EL device 2 does not need to be activated. Thus, compared to a conventional liquid crystal display unit with a backlight, the display unit of this modification reduces the consumption of the electricity.

In modification 6, the first organic EL apparatus is incorporated in a display. That is, the first organic EL apparatus may be combined with a conventional organic EL device driving method to form a display. As the organic EL device driving method, a passive matrix system or an active matrix system may be employed.

In the passive matrix system, an XY matrix electrode structure using scanning electrodes and signal electrodes is employed. At each of the dots forming the matrix, a display device (the organic EL device 2) is connected. The organic EL devices 2 are driven through the line sequential process and activated (emits light).

In the active matrix system, a switch device and a holding device are provided for each display device (organic EL device 2), that is, for each pixel or sub-pixel. The display devices (organic EL devices 2) are provided at the matrix intersections of the scanning electrodes and the signal electrodes. TFTs are preferably used as the switches.

In modification 7, the light extraction side is changed. That is, the first organic EL apparatus is not limited to a bottom emission type. The first organic EL apparatus may be configured to emit light from a side other than the bottom.

For example, when applied to a top emission type organic EL apparatus, the substrate 1 and the first electrode 20 do not need to be transparent. In this case, the second electrode 22 is made transparent so that light generated by the organic light-emitting layer 21 exits the apparatus through the second electrode 22. If a reflecting electrode is used as the first electrode 20 or if a reflection plate is provided on a side of the organic light-emitting layer 21 that is opposite from the light extraction side, part or all of the light that the organic light-emitting layer 21 emits toward the first electrode 20 exits the apparatus through the second electrode 22.

A second organic EL apparatus will now be described.

The second organic EL apparatus can be configured to be the same as the first organic EL apparatus except for the following points. Also, the second EL apparatus can be modified in the same ways as the first organic EL apparatus.

The second organic EL apparatus has an incident surface 11 and an organic EL device 2. The root mean square slope Δq of the incident surface 11 is in a range between 4° and 35°, inclusive. The organic EL device 2 is formed along the incident surface 11. Each layer of the organic EL device 2 is curved to conform to asperities formed on the incident surface 11.

Further, when the second organic EL apparatus is configured to have reflecting function, the root mean square slope Δq is preferably in a range between 4° and 20°, inclusive.

The root mean square slope Δq is specified in JIS B0601-1994. The root mean square slope Δq is computed in the following manner. First, a measured curve is divided along a mean line into sections each of which has a length of ΔX. Then, the inclination angle of a line segment of each section, which segment connects the starting point and the endpoint of the section, is obtained and squared. Thereafter, a mean value of the squared values is computed. Finally, the square root of the mean value is computed to obtain the root mean square slope Δq. That is, the root mean square slope Δq is computed using the following equation.

$$\Delta q = \left( \frac{1}{n-1} \sum_{i=1}^{n-1} \left\{ \tan^{-1}\left(\frac{\Delta Y_i}{\Delta X}\right) \right\}^2 \right)^{\frac{1}{2}}$$

The incident surface 11 of the second organic EL apparatus is designed to satisfy the requirements (a) or (b) for the same reasons listed above. The second organic EL apparatus, which is designed as described above, provides the same advantages as the first organic EL apparatus.

Further, as described above, asperities may be formed on the middle layer 3 or on the first electrode 20.

The inventors found out that the above ranges of the values are preferable for organic EL apparatus through the following examples and comparison examples.

In the following examples and the comparison examples, organic EL apparatuses were made while varying the root mean square slope Δq of the incident surface 11 in a range greater than 0° up to 40°. Other conditions including the materials, the film thicknesses, and the formulae were the same as the examples and the comparison examples of the first organic EL apparatus.

[Evaluation 4]

Figure 12:
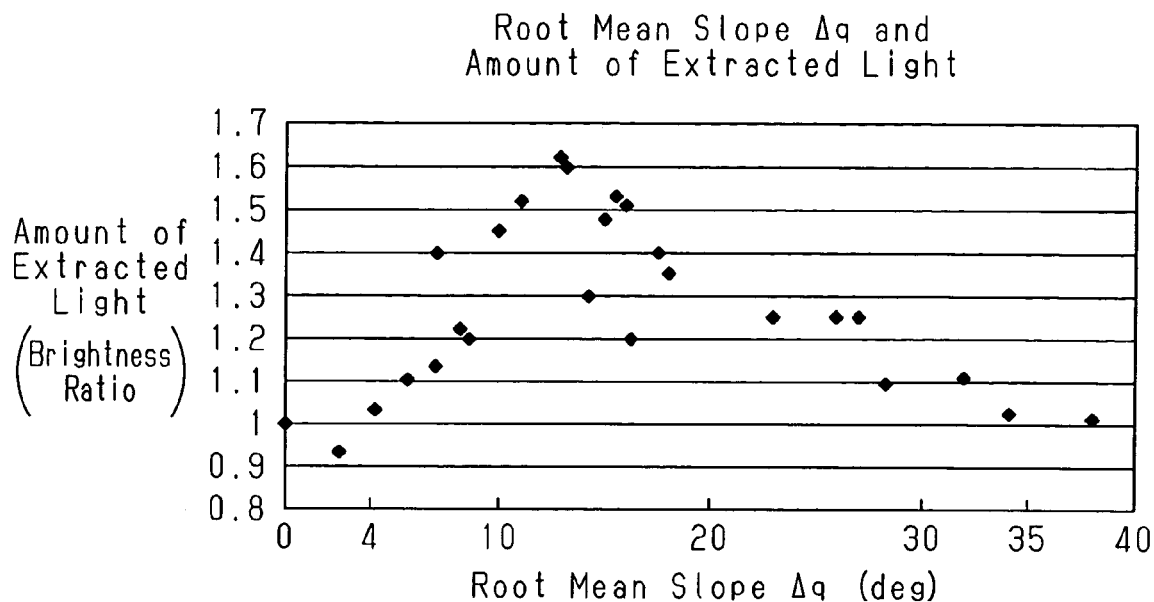
FIG. 12 is a graph representing an example and a comparison example of the second organic EL apparatus, showing the relationship between the root mean square slope $\Delta q$ and the brightness.

The same current was supplied to each of the formed organic EL apparatuses, and the total amount of light emitted from each of the light exit surfaces 10 was measured with a brightness meter. The relationship between the root mean square slope Δq of the incident surface 11 and the brightness of each organic EL apparatus is shown in the graph of FIG. 12. The brightness is expressed as a ratio to the brightness of an organic EL apparatus that has an organic EL device 2 formed in the same manner as described above but has no asperities on the incident surface 11. The brightness of the referential organic EL apparatus is plotted on a position where the root mean square slope Δq is 0°.

The inventors found out from the experiment results of FIG. 12 that if Δq is equal to or greater than 4°, the amount of light that exits through the light exit surface 10 is greater than that of a conventional organic EL apparatus having a flat incident surface.

[Evaluation 5]

Figure 13:
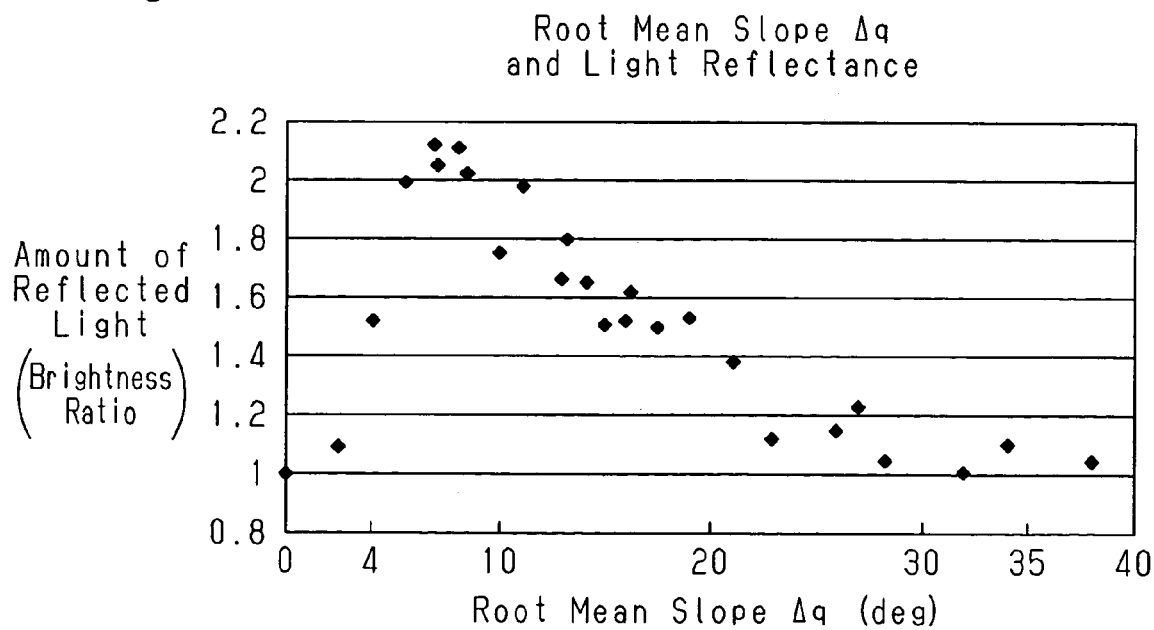
FIG. 13 is a graph representing an example and a comparison example of the second organic EL apparatus, showing the relationship between the root mean square slope $\Delta q$ and the reflection brightness as in FIG. 3.

Without activating the organic EL device 2 to emit light, the 30° incident light was applied to each organic EL apparatus, and the brightness of the reflected light in the normal direction of the light exit surface was measured with the brightness meter. The relationship between the root mean square slope Δq of the incident surface 11 and the brightness of the reflected light in the normal direction of the light exit surface is shown in the graph of FIG. 13. The brightness is expressed as a ratio to the brightness in the direction of the normal of an organic EL apparatus that has an organic EL device 2 formed in the same manner as described above but has no asperities on the incident surface 11. As in the above embodiment, the brightness of the referential organic EL apparatus is plotted on a position where the root mean square slope Δq is 0°.

The inventors found out from the experiment results of FIG. 13 that, if the Δq is in a range between 4° and 20°, inclusive, the ratio of the reflected light in the normal direction of the light exit surface to the 30° incident light is no less than 1.5 times that of a conventional organic EL apparatus having a flat incident surface. That is, the inventors found out that, compared to cases where the Δq is less than 4° or is more than 20°, the ratio of the reflected light is significantly increased.

The inventors also found out that, if Δq is in a range greater than 0° up to 40°, the amount of the reflected light in the normal direction of the light exit surface among the 30° incident light is greater than that of a case where no asperities are formed on the incident surface 11.

Further, the inventors found out that, unlike the case of conventional organic EL apparatus having no asperities on the incident surface, there was no specular reflection in the organic EL apparatus in which Δq is in a range greater than 0° up to 40°.

The inventors also found out that if a constant light is applied from a position shifted by an angle that is in a range of 20° to 40° relative to the normal direction of the light exit surface 10, the same advantages are obtained.

[Evaluation 6]

Further, three organic EL apparatuses each of which has an organic EL device 2 formed in the same manner as described above were formed while varying Δq to 40°, 45°, and 50°. Brightness unevenness was visually observed in these EL apparatuses when activated. On the other hand, in the organic EL apparatus Δq of which is greater than 0° and no more than 35°, no brightness unevenness was visually observed when the EL apparatus was activated to emit light.

The above results are considered to be caused by the fact that, if Δq of a incident surface 11 is greater than 35°, it is difficult to form an organic EL device 2 having an even thickness, particularly an organic light-emitting layer 21 having an even thickness, over the entire surface of a substrate 1.

As obvious from the above evaluations, the second organic EL apparatus provides the same advantages as the first organic EL apparatus.

A third organic EL apparatus will now be described. The third EL apparatus can be configured to be the same as the first organic EL apparatus except for the following points. Also, the third EL apparatus can be modified in the same ways as the first organic EL apparatus.

The third organic EL apparatus has asperities on the incident surface 11, and is characterized by satisfying the following requirement (i).

(i) The ratio Ra/Sm of the arithmetic mean roughness Ra to the mean spacing Sm of asperities is in a range between 0.008 and 0.09, inclusive.

To improve the reflection properties of the organic EL apparatus to a satisfactory level, the incident surface 11 is preferably designed to satisfy the following requirement (ii), instead of the requirement (i).

(ii) The ratio Ra/Sm of the arithmetic mean roughness Ra to the mean spacing Sm of asperities is in a range between 0.008 and 0.03, inclusive.

The arithmetic mean roughness Ra is specified in JIS B0601-1994. The arithmetic mean roughness Ra is computed in the following manner. First, a section that corresponds to a referential length L is chosen from a roughness curve along a direction of a mean line. Then, the absolute values of deviations f(x) of the chosen section from the mean line are obtained. Thereafter, a mean value of the absolute values is computed and expressed in micrometers. That is, the arithmetic mean roughness Ra is computed using the following equation.

$$Ra = \frac{1}{L}\int_0^L |f(x)| dx$$

Whichever of the requirements (i) and (ii) is used, the uneven incident surface 11 satisfies the above-described requirements (a) or (b).

The inventors found out that the conditions are preferable for organic EL apparatus through the following examples and comparison examples.

In the following examples and the comparison examples, organic EL apparatuses were made while varying the ratio Ra/Sm of the arithmetic mean roughness Ra to the mean spacing Sm of asperities on the incident surface 11 in a range between 0.001 and 0.10, inclusive. Also, S or Sm of the incident surface (uneven surface) 11 is configured to satisfy the requirement (a) or (b). Other conditions including the materials, the film thicknesses, and the formulae were the same as the examples and the comparison examples of the first organic EL apparatus. When forming the organic EL apparatuses of the examples and comparison examples, first the incident surface 11 was formed. Then the arithmetic mean roughness Ra and the mean spacing Sm of asperities of the incident surface 11 were measured with a roughness meter. Then, the first electrode 20 was formed on the incident surface 11.

[Evaluation 11]

Figure 14:
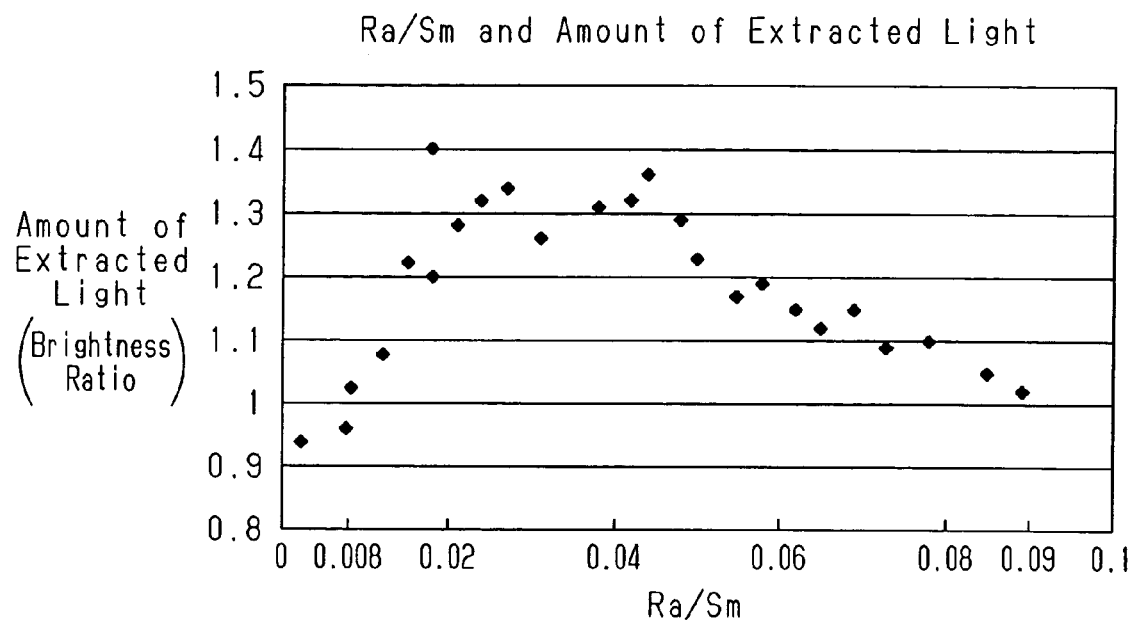
FIG. 14 is a graph representing a third organic EL apparatus, in which the relationship between the ratio Ra/Sm and the amount of extracted light is shown.

The same current was supplied to each of the formed organic EL apparatuses, and the total amount of light emitted from each of the light exit surfaces 10 was measured with a brightness meter. The relationship between the ratio Ra/Sm of the incident surface 11 and the brightness of the organic EL apparatuses is shown in the graph of FIG. 14. The brightness is expressed as a ratio to the brightness of an organic EL apparatus that has an organic EL device 2 formed in the same manner as described above but has no asperities on the incident surface 11.

The inventors found out from the experiment results of FIG. 14 that if the ratio Ra/Sm is equal to or greater than 0.008, the amount of light that exits from the light exit surface 10 is greater than that of a conventional organic EL apparatus having a flat incident surface.

In other words, the inventors found out that simply providing asperities on the incident surface 11 could result in decreasing the amount of light that exits through the light exit surface 10 compared to conventional organic EL apparatuses.

[Evaluation 12]

Figure 15:
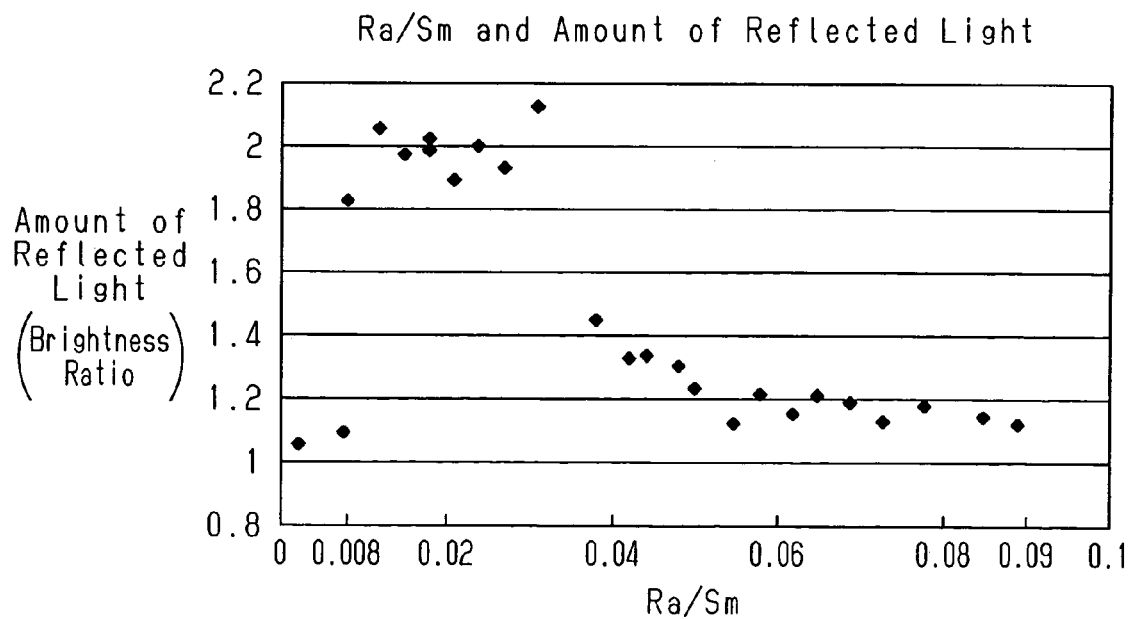
FIG. 15 is a graph representing the third organic EL apparatus, showing the relationship between the ratio Ra/Sm and the reflection brightness as in FIG. 3.

Without activating the organic EL device 2 to emit light, the 30° incident light was applied to each organic EL apparatus, and the brightness of the reflected light in the normal direction of the light exit surface was measured with the brightness meter. The relationship between the ratio Ra/Sm of the incident surface 11 and the brightness of the reflected light in the normal direction of the light exit surface is shown in the graph of FIG. 15. The brightness is expressed as a ratio to the brightness of an organic EL apparatus that has an organic EL device 2 formed in the same manner as described above but has no asperities on the incident surface 11.

The inventors found out from FIG. 15 that, if the ratio Ra/Sm is in a range between 0.008 and 0.03, inclusive, the ratio of the reflected light in the normal direction of the light exit surface to the 30° incident light is no less than 1.8 times that of a conventional organic EL apparatus having a flat incident surface. That is, the inventors found out that, compared to cases where the ratio Ra/Sm is less than 0.008 or is more than 0.03, the ratio of the reflected light is significantly increased.

The inventors also found out that, if the ratio Ra/Sm is in a range greater than 0 up to 0.09, the amount of the reflected light in the normal direction of the light exit surface among the 30° incident light is greater than that of a case where no asperities are formed on the incident surface 11.

Further, the inventors found out that, unlike the case of conventional organic EL apparatuses having no asperities on the incident surface, there was no specular reflection in the organic EL apparatus in which the ratio Ra/Sm is in a range greater than 0 up to 0.09.

The inventors also found out that if a constant light is applied from a position shifted by an angle that is in a range of 20° to 40° relative to the normal direction of the light exit surface 10, the same advantages are obtained.

[Evaluation 13]

Further, three organic EL apparatuses each of which has an organic EL device 2 formed in the same manner as described above were formed while varying the ratio Ra/Sm to 0.10, 0.13, and 0.15. Brightness unevenness was visually observed in these EL apparatuses when activated. On the other hand, in the organic EL apparatus the ratio Ra/Sm of which is in a range between 0.008 and 0.09 inclusive, no brightness unevenness was visually observed when activated.

These results are considered to be caused by the fact that, if the ratio Ra/Sm of a incident surface 11 is greater than 0.09, it is difficult to form an organic EL device 2 having an even thickness, particularly an organic light-emitting layer 21 having an even thickness, over the entire surface of a substrate 1. That is, since the organic light-emitting layer 21 has thick portions and thin portions, the brightness at the thin portions is increased as described above, which results in brightness unevenness.

Also, asperities having steep slopes the ratio Ra/Sm of which is greater than 0.09 create portions where no organic light-emitting layer 21 is formed, which causes leakage between the electrodes 20, 22 to occur.

The third organic EL apparatus, which is thus designed, has substantially the same advantages as the first organic EL apparatus. For example, when the third organic EL apparatus emits light, the brightness in a specific direction with respect to the light exit surface 10 is greater than the brightness in other directions. Also, it has been confirmed that the specific direction is changed by altering the ratio Ra/Sm.

Further, asperities may be formed on the middle layer 3 or on the first electrode 20.

A fourth organic EL apparatus will now be described. The fourth organic EL apparatus can be configured to be the same as the first organic EL apparatus except for the following points. Also, the fourth organic EL apparatus can be modified in the same ways as the first organic EL apparatus.

The incident surface 11 of the fourth organic EL apparatus satisfies the following requirement (iii). The organic EL device 2 of the fourth organic EL apparatus is formed along the incident surface 11. Each layer of the organic EL device 2 is curved to conform to asperities formed on the incident surface 11.

(iii) The ratio Ra/S of the arithmetic mean roughness Ra to the mean spacing S of peaks is in a range between 0.009 and 0.10, inclusive.

Further, when the fourth organic EL apparatus is configured to have a reflecting function, the fourth organic EL apparatus preferably satisfies the following requirement (iv) instead of the requirement (iii).

(iv) The ratio Ra/S of the arithmetic mean roughness Ra to the mean spacing S of peaks is in a range between 0.009 and 0.03, inclusive.

Whichever of the requirements (iii) and (iv) is used, the incident surface 11 satisfies the requirements (a) or (b) for the above listed reasons.

The fourth organic EL apparatus, which is thus designed, has substantially the same advantages as the first organic EL apparatus.

The inventors found out that the above ranges of the values are preferable for organic EL apparatus through the following examples and comparison examples.

In the examples and the comparison examples, organic EL apparatuses were made while varying the ratio Ra/S of the arithmetic mean roughness Ra to the mean spacing S of peaks in a range between 0.001 and 0.15, inclusive. Other conditions including the materials, the film thicknesses, and the formulae were the same as the examples and the comparison examples of the first organic EL apparatus.

[Evaluation 14]

Figure 16:
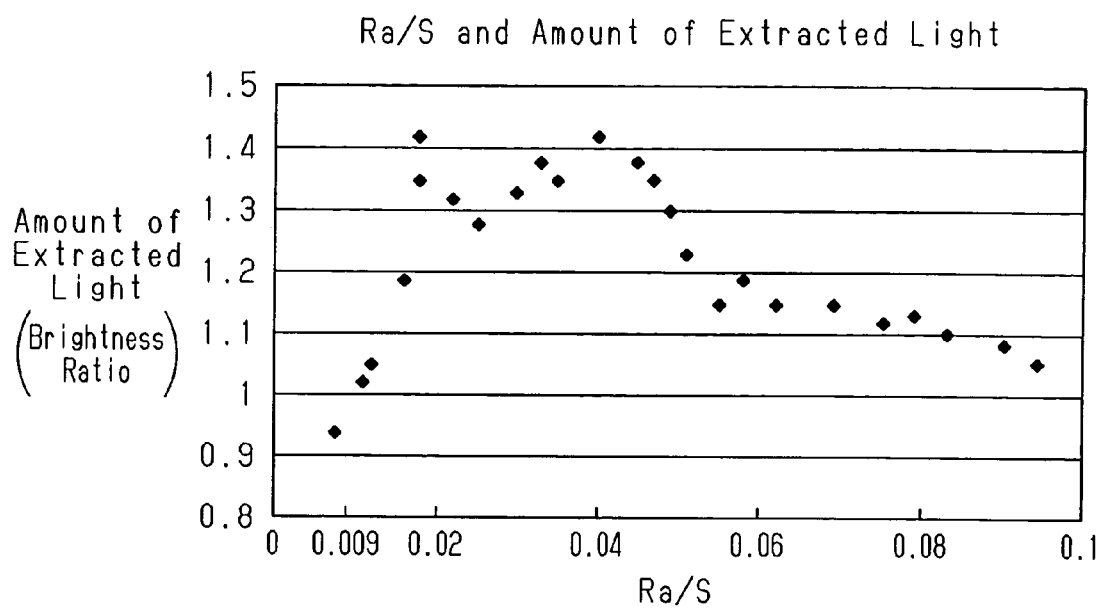
FIG. 16 is a graph representing a fourth organic EL apparatus, in which the relationship between the ratio Ra/S and the amount of extracted light is shown.

The same current was supplied to each of the formed organic EL apparatuses, and the total amount of light emitted from each of the light exit surfaces 10 was measured with a brightness meter. The relationship between the ratio Ra/S of the incident surface 11 and the brightness of the organic EL apparatuses is shown in the graph of FIG. 16. The brightness is expressed as a ratio to the brightness of an organic EL apparatus that has an organic EL device 2 formed in the same manner as described above but has no asperities on the incident surface 11.

The inventors found out from the experiment results of FIG. 16 that if the ratio Ra/S is equal to or greater 0.009, the amount of light that exits through the light exit surface 10 is greater than that of a conventional organic EL apparatus having a flat incident surface.

In other words, the inventors found out that simply providing asperities on the incident surface 11 could result in decreasing the amount of light that exits through the light exit surface 10 compared to conventional organic EL apparatuses.

[Evaluation 15]

Figure 17:
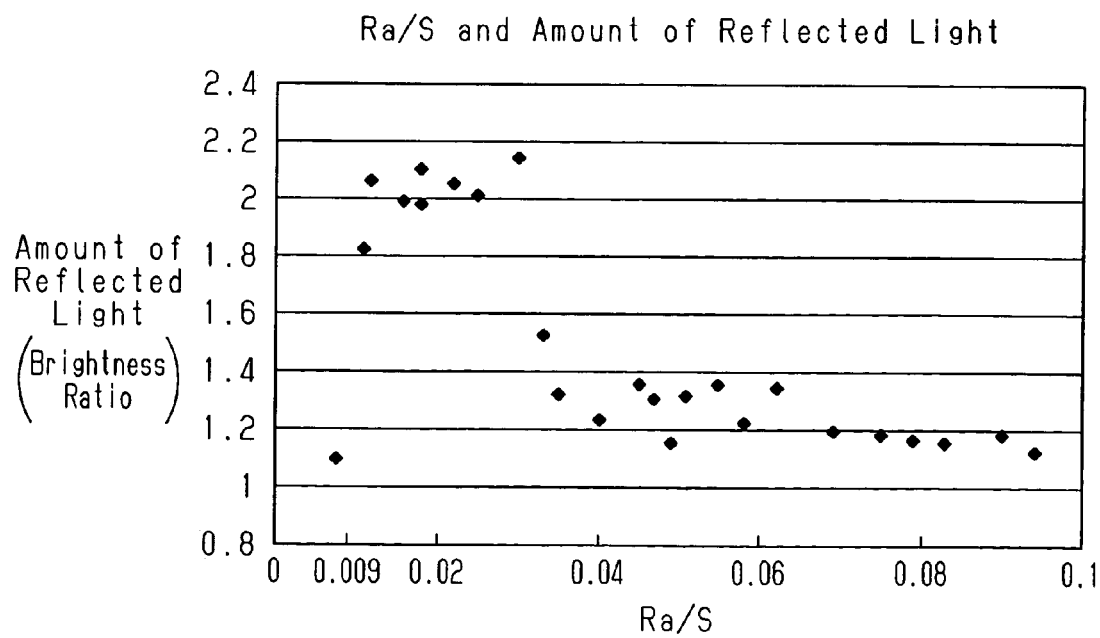
FIG. 17 is a graph representing the fourth organic EL apparatus, showing the relationship between the ratio Ra/S and the reflection brightness as in FIG. 3.

Without activating the organic EL device 2 to emit light, the 30° incident light was applied to each organic EL apparatus, and the brightness of the reflected light in the normal direction of the light exit surface was measured with the brightness meter. The relationship between the ratio Ra/S of the incident surface 11 and the brightness of the reflected light in the normal direction of the light exit surface is shown in the graph of FIG. 17. The brightness is expressed as a ratio to the brightness of an organic EL apparatus that has an organic EL device 2 formed in the same manner as described above but has no asperities on the incident surface 11.

The inventors found out from FIG. 17 that, if the ratio Ra/S is in a range between 0.009 and 0.03, inclusive, the ratio of the reflected light in the normal direction of the light exit surface to the 30° incident light is no less than 1.5 times that of a conventional organic EL apparatus having a flat incident surface. That is, the inventors found out that, compared to cases where the ratio Ra/S is less than 0.009 or is more than 0.03, the ratio of the reflected light is significantly increased.

The inventors also found out that, if the ratio Ra/S is in a range greater than 0 up to 0.10, the amount of the reflected light in the normal direction of the light exit surface among the 30° incident light is greater than that of a case where no asperities are formed on the incident surface 11.

Further, the inventors found out that, unlike the case of conventional organic EL apparatuses having no asperities on the incident surface, there was no specular reflection in the organic EL apparatus in which the ratio Ra/S is in a range greater than 0 up to 0.10.

The inventors also found out that if a constant light is applied from a position shifted by an angle that is in a range of 20° to 40° relative to the normal direction of the light exit surface 10, the same advantages are obtained.

[Evaluation 16]

Also, three organic EL apparatuses each of which has an organic EL device 2 formed in the same manner as described above were formed while varying the ratio Ra/S to 0.12, 0.15, and 0.18. Brightness unevenness was visually observed in these EL apparatuses when activated. On the other hand, in the organic EL apparatus the ratio Ra/S of which is in a range between 0.009 and 0.10, inclusive, no brightness unevenness was observed when activated.

These results are considered to be caused by the fact that, if the ratio Ra/S of the incident surface 11 is greater than 0.10, it is difficult to form an organic EL device 2 having an even thickness, particularly an organic light-emitting layer 21 having an even thickness, over the entire surface of a substrate 1.

A fifth organic EL apparatus will now be described. The fifth EL apparatus can be configured to be the same as the first organic EL apparatus except for the following points. Also, the fifth EL apparatus can be modified in the same ways as the first organic EL apparatus.

The incident surface 11 of the fifth organic EL apparatus satisfies the following requirement (v). The organic EL device 2 of the fifth organic EL apparatus is formed along the incident surface 11. Each layer of the organic EL device 2 is curved to conform to asperities formed on the incident surface 11.

(v) The ratio Rz/Sm of the ten-point height of irregularities Rz to the mean spacing Sm of asperities is in a range between 0.05 and 0.22, inclusive.

Further, when the fifth organic EL apparatus is configured to have a reflecting function, the incident surface 11 is preferably designed to satisfy the following requirement (vi), instead of the requirement (v).

(vi) The ratio Rz/Sm of the ten-point height of irregularities Rz to the mean spacing Sm of asperities is in a range between 0.05 and 0.14, inclusive.

The ten-point height of irregularities Rz is specified in JIS B0601-1994. The ten-point height of irregularities Rz is computed in the following manner. First, a section that corresponds to a referential length L is chosen from a roughness curve along a direction in which a mean line extends. Then, the average of the five highest peaks Yp1–Yp5 from the mean line and the average depth of the five deepest valleys Yv1–Yv5 from the mean line are computed. The ten-point height of irregularities Rz is obtained by computing the sum of the averages and by expressing the sum in micrometers. That is, the ten-point height of irregularities Rz is computed using the following equation.

$$Rz = \frac{|Yp1 + Yp2 + Yp3 + Yp4 + Yp5| + |Yv1 + Yv2 + Yv3 + Yv4 + Yv5|}{5}$$

Whichever of the requirements (v) and (vi) is used, the incident surface 11 satisfies the requirements (a) or (b) for the above listed reasons.

The fifth organic EL apparatus, which is thus designed, has substantially the same advantages as the first organic EL apparatus.

The inventors found out that the above ranges of the values are preferable for organic EL apparatus through the following examples and comparison examples.

In the following examples and the comparison examples, organic EL apparatuses were made while varying the ratio Rz/Sm of the ten-point height of irregularities Rz to the mean spacing Sm of asperities on the incident surface 11 in a range between 0.001 and 0.30, inclusive. Other conditions including the materials, the film thicknesses, and the formulae were the same as the examples and the comparison examples of the first organic EL apparatus.

[Evaluation 17]

Figure 18:
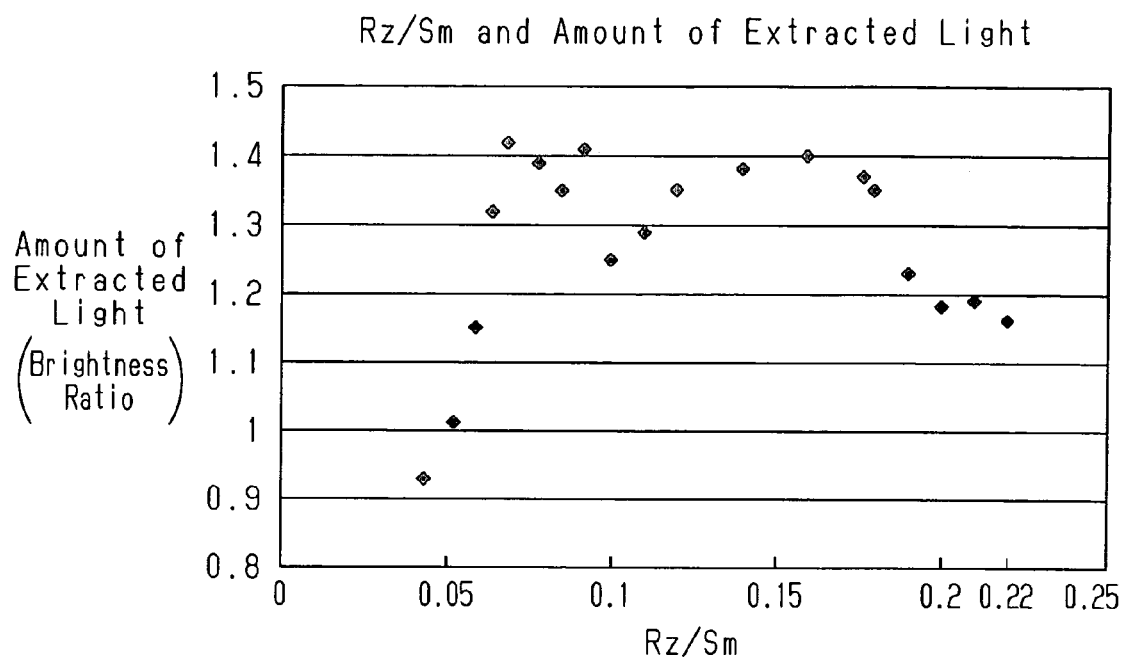
FIG. 18 is a graph representing a fifth organic EL apparatus, in which the relationship between the ratio Rz/Sm and the amount of extracted light is shown.

The same current was supplied to each of the formed organic EL apparatuses, and the total amount of light emitted from each of the light exit surfaces 10 was measured with a brightness meter. The relationship between the ratio Rz/Sm of the incident surface 11 and the brightness of the organic EL apparatuses is shown in the graph of FIG. 18. The brightness is expressed as a ratio to the brightness of an organic EL apparatus that has an organic EL device 2 formed in the same manner as described above but has no asperities on the incident surface 11.

The inventors found out from the experiment results of FIG. 18 that if the ratio Rz/Sm is equal to or greater than 0.05, the amount of light that exits through the light exit surface 10 is greater than that of a conventional organic EL apparatus having a flat incident surface.

[Evaluation 18]

Figure 19:
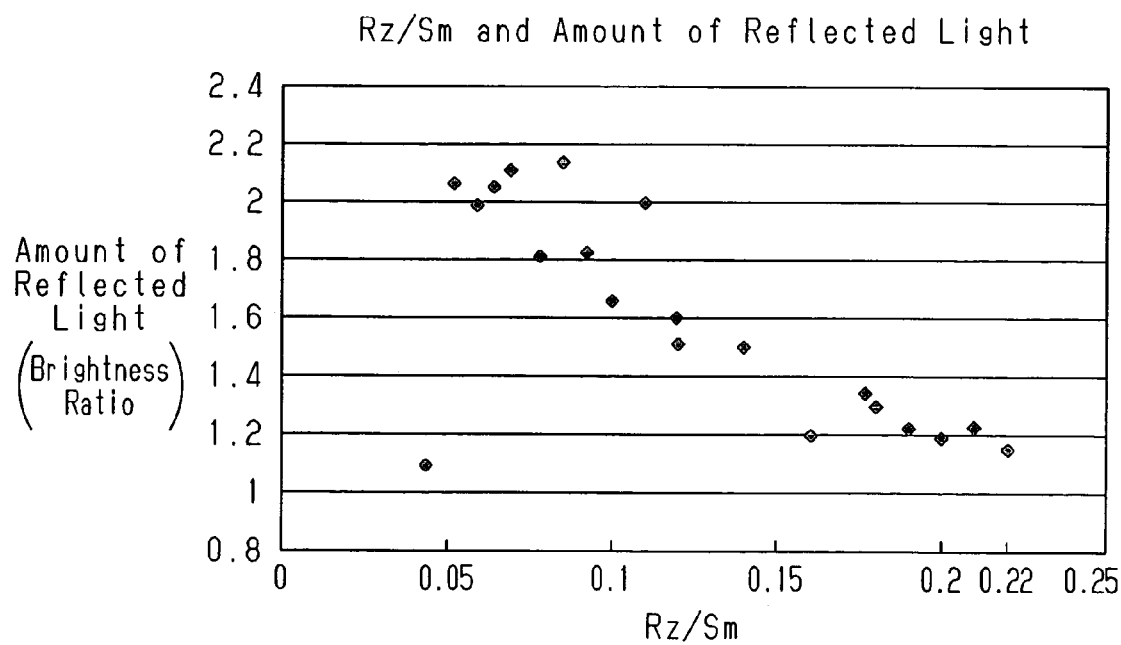
FIG. 19 is a graph representing the fifth organic EL apparatus, showing the relationship between the ratio Rz/Sm and the reflection brightness as in FIG. 3.

Without activating the organic EL device 2 to emit light, the 30° incident light was applied to each organic EL apparatus, and the brightness of the reflected light in the normal direction of the light exit surface was measured with the brightness meter. The relationship between the ratio Rz/Sm of the incident surface 11 and the brightness of the reflected light in the normal direction of the light exit surface is shown in the graph of FIG. 19. The brightness is expressed as a ratio to the brightness of an organic EL apparatus that has an organic EL device 2 formed in the same manner as described above but has no asperities on the incident surface 11.

The inventors found out from FIG. 19 that, if the ratio Rz/Sm is in a range between 0.05 and 0.14, inclusive, the ratio of the reflected light in the normal direction of the light exit surface to the 30° incident light is no less than 1.5 times that of a conventional organic EL apparatus having a flat incident surface. That is, the inventors found out that, compared to cases where the ratio Rz/Sm is less than 0.05 or is more than 0.14, the ratio of the reflected light is significantly increased.

The inventors also found out that, if the ratio Rz/Sm is in a range greater than 0 up to 0.22, the amount of the reflected light in the normal direction of the light exit surface among the 30 incident light is greater than that of a case where no asperities are formed on the incident surface 11.

Further, the inventors found out that, unlike the case of conventional organic EL apparatuses having no asperities on the incident surface, there was no specular reflection in the organic EL apparatus in which the ratio Rz/Sm is in a range greater than 0 up to 0.22.

The inventors also found out that if a constant light is applied from a position shifted by an angle that is in a range of 20° to 40° relative to the normal direction of the light exit surface 10, the same advantages are obtained.

[Evaluation 19]

Further, three organic EL apparatuses each of which has an organic EL device 2 formed in the same manner as described above were formed while varying the ratio Rz/Sm to 0.03, 0.04, and 0.05. Brightness unevenness was visually observed in these EL apparatuses when activated. On the other hand, in the organic EL apparatus the ratio Rz/Sm of which is in a range between 0.05 and 0.22 inclusive, no brightness unevenness was visually observed when activated.

These results are considered to be caused by the fact that, if the ratio Rz/Sm of a incident surface 11 is greater than 0.22, it is difficult to form an organic EL device 2 having an even thickness, particularly an organic light-emitting layer 21 having an even thickness, over the entire surface of a substrate 1.

A sixth organic EL apparatus will now be described. The sixth EL apparatus can be configured to be the same as the first organic EL apparatus except for the following points. Also, the sixth EL apparatus can be modified in the same ways as the first organic EL apparatus.

The incident surface 11 of the sixth organic EL apparatus satisfies the following requirement (vii). The organic EL device 2 of the sixth organic EL apparatus is formed along the incident surface 11. Each layer of the organic EL device 2 is curved to conform to asperities formed on the incident surface 11.

(vii) The ratio Rz/S of the ten-point height of irregularities Rz to the mean spacing S of peaks is in a range between 0.05 and 0.25, inclusive.

Further, when the sixth organic EL apparatus is configured to have reflecting function, the incident surface 11 is preferably designed to satisfy the following requirement (viii), instead of the requirement (vii).

(viii) The ratio Rz/S of the ten-point height of irregularities Rz to the mean spacing S of peaks is in a range between 0.048 and 0.12, inclusive.

Whichever of the requirements (vii) and (viii) is used, the incident surface 11 satisfies the requirements (a) or (b) for the above listed reasons.

The sixth organic EL apparatus, which is thus designed, has substantially the same advantages as the first organic EL apparatus.

The inventors found out that the above ranges of the values are preferable for organic EL apparatus through the following examples and comparison examples.

In the following examples and the comparison examples, organic EL apparatuses were made while varying the ratio Rz/S of the ten-point height of irregularities Rz to the mean spacing S of peaks of the incident surface 11 in a range greater than 0.01 and 0.03, inclusive. Other conditions including the materials, the film thicknesses, and the formulae were the same as the examples and the comparison examples of the first organic EL apparatus.

[Evaluation 20]

Figure 20:
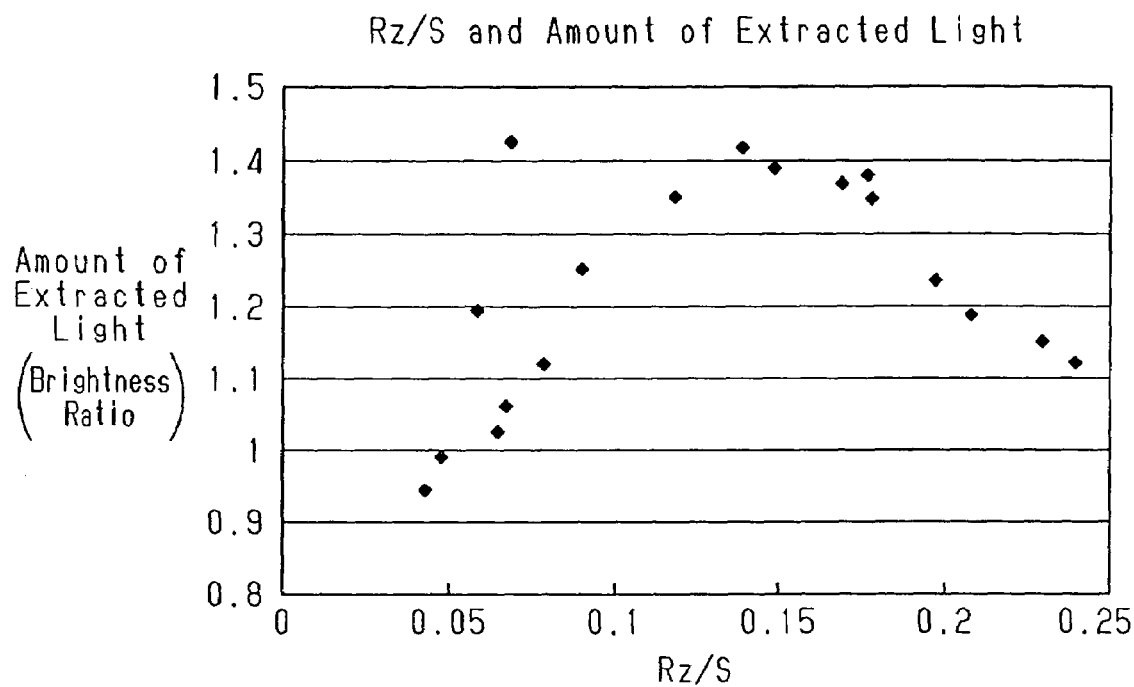
FIG. 20 is a graph representing a sixth organic EL apparatus, in which the relationship between the ratio Rz/S and the amount of extracted light is shown.

The same current was supplied to each of the formed organic EL apparatuses, and the total amount of light emitted from each of the light exit surfaces 10 was measured with a brightness meter. The relationship between the ratio Rz/S of the incident surface 11 and the brightness of the organic EL apparatuses is shown in the graph of FIG. 20. The brightness is expressed as a ratio to the brightness of an organic EL apparatus that has an organic EL device 2 formed in the same manner as described above but has no asperities on the incident surface 11.

The inventors found out from the experiment results of FIG. 20 that if the ratio Rz/S is equal to or greater than 0.05, the amount of light that exits through the light exit surface. 10 is greater than that of a conventional organic EL apparatus having a flat incident surface.

[Evaluation 21]

Without activating the organic EL device 2 to emit light, the 30° incident light was applied to each organic EL apparatus, and the brightness of the reflected light in the normal direction of the light exit surface was measured with the brightness meter.

Figure 21:
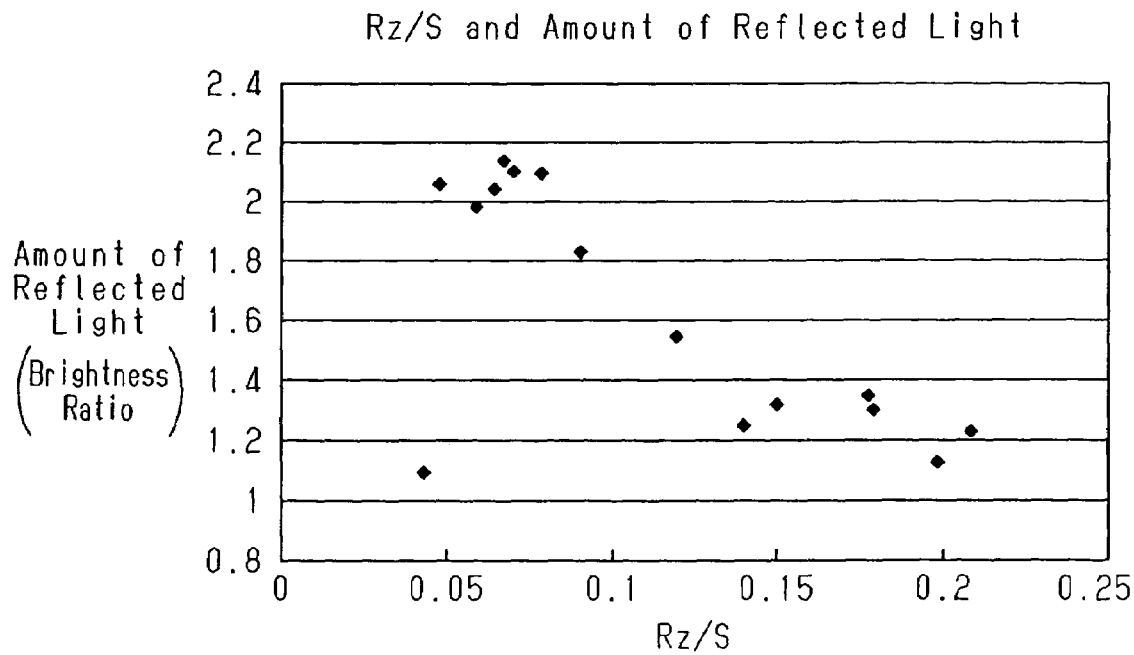
FIG. 21 is a graph representing the sixth organic EL apparatus, showing the relationship between the ratio Rz/S and the reflection brightness as in FIG. 3.
Figure 22:
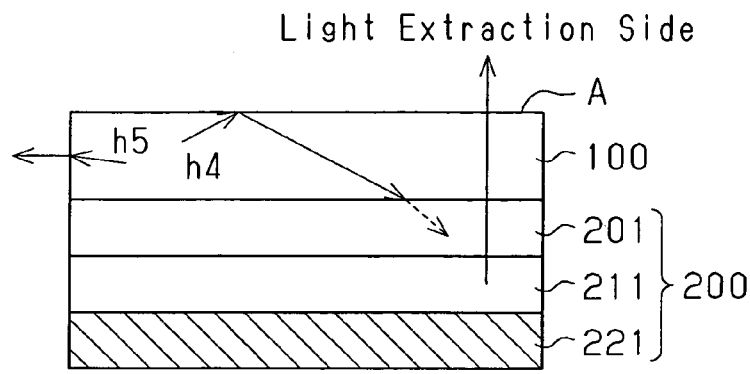
FIG. 22 is a cross-sectional view illustrating a prior art organic EL apparatus of a bottom emission type and drawbacks of the apparatus.
Figure 23A:
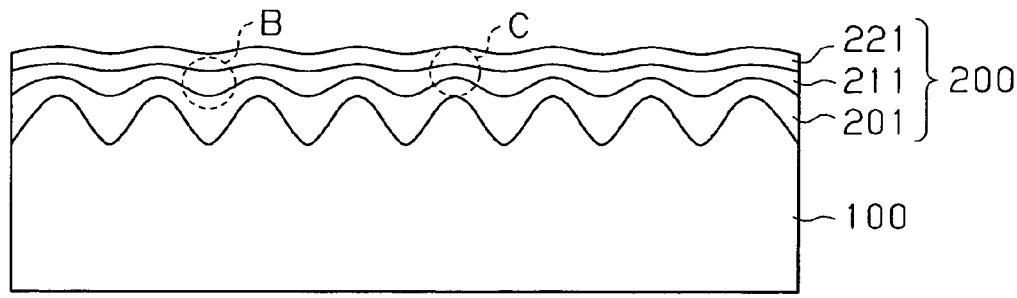
FIGS. 23(a) and 23(b) are cross-sectional views for explaining drawbacks of a prior art light-emitting apparatus that has asperities on a incident surface of a substrate 100.
Figure 23B:
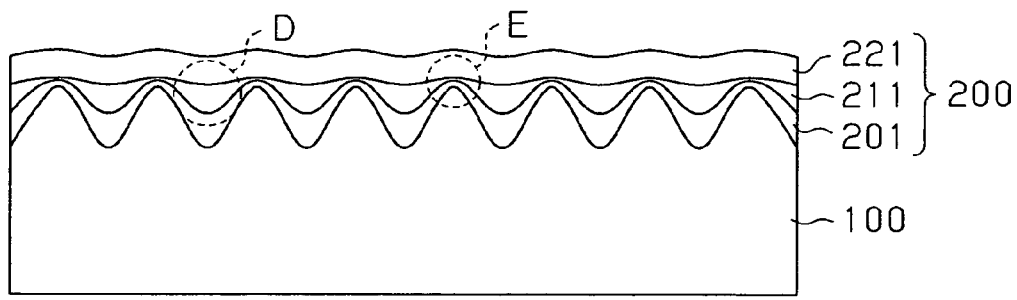
Figure 24:
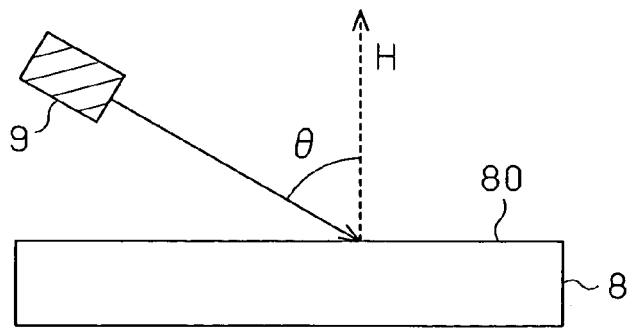
FIG. 24 is a cross-sectional view for explaining drawbacks of a case where a light-emitting apparatus is used as a backlight of a liquid crystal display unit.

The relationship between the ratio Rz/S of the incident surface 11 and the brightness of the reflected light in the normal direction of the light exit surface is shown in the graph of FIG. 21. The brightness is expressed as a ratio to the brightness in the direction of the normal of an organic EL apparatus that has an organic EL device 2 formed in the same manner as described above but has no asperities on the incident surface 11.

The inventors found out from FIG. 21 that, if the ratio Rz/S is in a range between 0.048 and 0.12, inclusive, the ratio of the reflected light in the normal direction of the light exit surface to the 30° incident light is no less than 1.5 times that of a conventional organic EL apparatus having a flat incident surface. That is, the inventors found out that, compared to cases where the ratio Rz/S is less than 0.048 or is more than 0.12, the ratio of the reflected light is significantly increased.

The inventors also found out that, if the ratio Rz/S is in a range greater than 0 up to 0.25, the amount of the reflected light in the normal direction of the light exit surface among the 30° incident light is greater than that of a case where no asperities are formed on the incident surface 11.

Further, the inventors found out that, unlike the case of conventional organic EL apparatuses having no asperities on the incident surface, there was no specular reflection in the organic EL apparatus in which the ratio Rz/S is in a range greater than 0 up to 0.25.

The inventors also found out that if a constant light is applied from a position shifted by an angle that is in a range of 20° to 40° relative to the normal direction of the light exit surface 10, the same advantages are obtained.

[Evaluation 22]

Further, three organic EL apparatuses each of which has an organic EL device 2 formed in the same manner as described above were formed while varying the ratio Rz/S to 0.30, 0.35, and 0.40. Brightness unevenness was visually observed in these EL apparatuses when activated. On the other hand, in the organic EL apparatus the ratio Rz/S of which is in a range between 0.05 and 0.25, inclusive, no brightness unevenness was observed when activated.

These results are considered to be caused by the fact that, if the ratio Rz/S of a light exit surface 10 is greater than 0.25, it is difficult to form an organic EL device 2 having an even thickness, particularly an organic light-emitting layer 21 having an even thickness, over the entire surface of a substrate 1.

The present examples and embodiments are to be considered as illustrative and not restrictive and the invention is not to be limited to the details given herein, but may be modified within the scope and equivalence of the appended claims.

The invention claimed is:

1. A light-emitting apparatus comprising a substrate and a light-emitting device provided on the substrate,
wherein the device includes a light-emitting layer located between a pair of electrodes, a face of the substrate on which the light-emitting device is formed is an uneven surface having a plurality of asperities, the mean spacing Sm of adjacent asperities or the mean spacing S of peaks of adjacent projections of the asperities is no less than three times the longest wavelength of light generated by the light-emitting layer and no more than two hundred times the longest wavelength, wherein at least one of the following requirements (i)–(vi) is satisfied:
(i) the arithmetic mean slope $\Delta a$ of the uneven surface is in a range between 4° and 30°, inclusive;
(ii) the root mean square slope $\Delta q$ of the uneven surface is in a range between 4° and 35°;
(iii) the ratio Ra/Sm of the arithmetic mean roughness Ra of the uneven surface to the mean spacing Sm of asperities is in a range between 0.008 and 0.09, inclusive;
(iv) the ratio Ra/S of the arithmetic mean roughness Ra to the mean spacing S of peaks is in a range between 0.009 and 0.10, inclusive;
(v) the ratio Rz/Sm of the ten-point height of irregularities Rz of the uneven surface to the mean spacing Sm of asperities is in a range between 0.05 and 0.22, inclusive; and
(vi) the ratio Rz/S of the ten-point height of irregularities Rz to the mean spacing S of peaks is in a range between 0.05 and 0.25, inclusive.

2. The apparatus according to claim 1, wherein at least the requirement (i) is satisfied.

3. The apparatus according to claim 1, wherein at least the requirement (ii) is satisfied.

4. The apparatus according to claim 1, wherein at least the requirement (iii) is satisfied.

5. The apparatus according to claim 1, wherein at least the requirement (iv) is satisfied.

6. The apparatus according to claim 1, wherein at least the requirement (v) is satisfied.

7. The apparatus according to claim 1, wherein at least the requirement (vi) is satisfied.

8. The apparatus according to claim 1, wherein the light-emitting device is curved along the uneven surface.

9. The apparatus according to claim 8, wherein the light-emitting layer has a first face at a side facing the substrate and a second face that is opposite from the first face, wherein the first and second faces are curved along the uneven surface, and the projections of the first face correspond to the depressions of the second face, and the depressions of the first face correspond to the projections of the second face.

10. The apparatus according to claim 8, wherein the electrodes and the light-emitting layer are each formed to have a constant thickness.

11. The apparatus according to claim 1, wherein a prism sheet is provided on a side where light generated by the light-emitting layer is extracted.

12. The apparatus according to claim 1, wherein the light-emitting device is an organic electroluminescent device.

13. A method for manufacturing a light-emitting apparatus having a light-emitting layer, comprising:
preparing a substrate;
forming an uneven surface having a plurality of asperities on a face of the substrate, wherein the mean spacing Sm of adjacent asperities or the mean spacing S of peaks of adjacent projections of the asperities is no less than three times the longest wavelength of light generated by the light-emitting layer and no more than two hundred times the longest wavelength, wherein the uneven surface is formed such that at least one of the following requirements (i)–(vi) is satisfied:
(i) the arithmetic mean slope $\Delta a$ of the uneven surface is in a range between 4° and 30°, inclusive;
(ii) the root mean square slope $\Delta q$ of the uneven surface is in a range between 4° and 35°;
(iii) the ratio Ra/Sm of the arithmetic mean roughness Ra of the uneven surface to the mean spacing Sm of asperities is in a range between 0.008 and 0.09, inclusive;
(iv) the ratio Ra/S of the arithmetic mean roughness Ra to the mean spacing S of peaks is in a range between 0.009 and 0.10, inclusive;
(v) the ratio Rz/Sm of the ten-point height of irregularities Rz of the uneven surface to the mean spacing Sm of asperities is in a range between 0.05 and 0.22, inclusive; and
(vi) the ratio Rz/S of the ten-point height of irregularities Rz to the mean spacing S of peaks is in a range between 0.05 and 0.25, inclusive, and
forming on the uneven surface a light-emitting device having the light-emitting layer and a pair of electrodes between which the light-emitting layer is located such that the light-emitting device is curved along the uneven surface.

* * * * *

UNITED STATES PATENT AND TRADEMARK OFFICE
CERTIFICATE OF CORRECTION

PATENT NO.        : 7,071,617 B2                                       Page 1 of 1
APPLICATION NO. : 10/844923
DATED             : July 4, 2006
INVENTOR(S)       : Tetsuya Utsumi et al.

It is certified that error appears in the above-identified patent and that said Letters Patent is hereby corrected as shown below:

In the Specification

At column 2, line 50: please delete "views the apparatus" and substitute therefor -- viewing the apparatus--; and At column 24, line 66; please delete "the 30 incident light" and substitute therefor -- the 30° incident light--.

Signed and Sealed this

Thirty-first Day of July, 2007

JON W. DUDAS
*Director of the United States Patent and Trademark Office*